(12) United States Patent
Matsugai et al.

(10) Patent No.: US 9,941,321 B2
(45) Date of Patent: *Apr. 10, 2018

(54) SEMICONDUCTOR DEVICE AND METHOD OF MANUFACTURING SEMICONDUCTOR DEVICE

(71) Applicant: Sony Corporation, Tokyo (JP)

(72) Inventors: Hiroyasu Matsugai, Kanagawa (JP); Kiyotaka Tabuchi, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/273,495

(22) Filed: Sep. 22, 2016

(65) Prior Publication Data

US 2017/0012074 A1    Jan. 12, 2017

Related U.S. Application Data

(63) Continuation of application No. 13/410,389, filed on Mar. 2, 2012, now Pat. No. 9,472,472.

(30) Foreign Application Priority Data

Mar. 28, 2011  (JP) ................... 2011-071043

(51) Int. Cl.
*H01L 27/146* (2006.01)
*H01L 21/66* (2006.01)
*H01L 21/768* (2006.01)
*H01L 23/00* (2006.01)
*H01L 25/065* (2006.01)
*H01L 25/00* (2006.01)
*H01L 27/06* (2006.01)

(52) U.S. Cl.
CPC .. *H01L 27/14634* (2013.01); *H01L 21/76898* (2013.01); *H01L 22/12* (2013.01); *H01L 22/20* (2013.01); *H01L 23/562* (2013.01); *H01L 25/0657* (2013.01); *H01L 25/50* (2013.01); *H01L 27/1469* (2013.01); *H01L 27/14636* (2013.01); *H01L 27/0688* (2013.01); *H01L 2224/08145* (2013.01); *H01L 2224/16* (2013.01); *H01L 2224/24147* (2013.01); *H01L 2224/80896* (2013.01); *H01L 2224/8203* (2013.01); *H01L 2224/92* (2013.01); *H01L 2225/06541* (2013.01); *H01L 2924/13091* (2013.01)

(58) Field of Classification Search
CPC ......... H01L 2924/3511; H01L 21/2007; H01L 21/76251; H01L 127/0688; H01L 121/8221; H01L 27/14634; H05K 1/0271
See application file for complete search history.

(56) References Cited

U.S. PATENT DOCUMENTS

2008/0157380 A1* 7/2008 Hong ................ H01L 21/76849
257/751
2010/0238331 A1* 9/2010 Umebayashi ..... H01L 27/14632
348/294

* cited by examiner

*Primary Examiner* — Tucker J Wright
(74) *Attorney, Agent, or Firm* — Sheridan Ross P.C.

(57) ABSTRACT

A semiconductor device includes a first semiconductor substrate, a second semiconductor substrate, a first main surface side of the first semiconductor substrate and a first main surface side of the second semiconductor substrate being bonded to each other; and a warpage correction layer which is formed on at least one or more selected from the first main surface side of the first semiconductor substrate, the first main surface side of the second semiconductor substrate, a second main surface side of the first semiconductor substrate, and a second main surface side of the second semiconductor substrate.

20 Claims, 12 Drawing Sheets

151

21

27

SEMICONDUCTOR DEVICE AND METHOD OF MANUFACTURING SEMICONDUCTOR DEVICE

BACKGROUND

The present disclosure relates to a semiconductor device having a configuration in which semiconductor substrates are bonded to each other and a method of manufacturing a semiconductor device.

A process of manufacturing a semiconductor device such as an image sensor includes a process of bonding a semiconductor substrate in which an imaging device is formed to another semiconductor substrate, a glass substrate or the like. In the process of bonding substrates, semiconductor substrates are bonded to each other using plasma bonding or an adhesive.

On the other hand, a warpage may be generated in a semiconductor substrate due to the stress difference between an insulating layer, a wiring line or the like formed on a semiconductor substrate and the semiconductor substrate. When a warpage is generated in semiconductor substrates to be bonded, the bonding accuracy is lowered in the above-mentioned bonding process. For this reason, in order to realize high-accuracy bonding, it is necessary to correct a warpage of a semiconductor substrate.

In bonding between a semiconductor substrate and a glass substrate, a method is proposed in which a warpage is corrected by forming a groove in the glass substrate and reducing the stress difference between the glass substrate and a thin film formed in the glass substrate (see Japanese Unexamined Patent Application Publication No. 2006-282480).

SUMMARY

The above-mentioned technique for correcting the warpage of the glass substrate is a technique for bonding the semiconductor substrate to a supporting substrate such as the glass substrate. For this reason, when the above-mentioned technique is applied to the bonding between the semiconductor substrates, a groove formed in order to reduce stress becomes a void in the bonding surface, which results in difficulty in performing high-accuracy bonding.

It is desirable to provide a semiconductor device and a method of manufacturing a semiconductor device which are capable of improving the bonding accuracy in a configuration in which semiconductor substrates are bonded to each other.

According to an embodiment of the present disclosure, there is provided a semiconductor device including: a first semiconductor substrate; and a second semiconductor substrate, a first main surface side of the first semiconductor substrate and a first main surface side of the second semiconductor substrate being bonded to each other. The semiconductor device according to the embodiment of the present disclosure includes a warpage correction layer which is formed on at least one or more selected from the first main surface side of the first semiconductor substrate, the first main surface side of the second semiconductor substrate, a second main surface side of the first semiconductor substrate, and a second main surface side of the second semiconductor substrate.

According to another embodiment of the present disclosure, there is provided a method of manufacturing a semiconductor device, including forming a warpage correction layer on at least one or more selected from a first main surface side of a first semiconductor substrate, a second main surface side of the first semiconductor substrate, a first main surface side of a second semiconductor substrate, and a second main surface side of the second semiconductor substrate. The method of manufacturing a semiconductor device according to the embodiment of present disclosure includes bonding the first main surface side of the first semiconductor substrate and the first main surface side of the second semiconductor substrate to each other.

In the semiconductor device and the method of manufacturing a semiconductor device according to the embodiments of the present disclosure, the warpage correction layer is formed on at least any one of both main surfaces of the first semiconductor substrate and the second semiconductor substrate. The warpage correction layer is formed, whereby at least the warpage of the first semiconductor substrate or the second semiconductor substrate is corrected. For this reason, it is possible to perform the high-accuracy bonding in the bonding between semiconductor substrates.

According to the embodiments of the present disclosure, it is possible to provide a semiconductor device in which semiconductor substrates are bonded to each other with a high degree of accuracy.

DETAILED DESCRIPTION OF EMBODIMENTS

Hereinafter, examples of embodiments for carrying out the present disclosure are described, but the present disclosure is not limited to the following examples.

Meanwhile, the description will be made in the following order.

1. Outline of Semiconductor Device
2. First Embodiment of Semiconductor Device
3. Method of Manufacturing Semiconductor Device According to First Embodiment
4. Second Embodiment of Semiconductor Device <1. Outline of Semiconductor Device>

[Configuration (1) of MOS Solid-State Imaging Device]

As an example of a semiconductor device, an amplification type solid-state imaging device represented by a MOS type image sensor such as a CMOS (Complementary Metal Oxide Semiconductor) is known. In addition, a charge-transfer type solid-state imaging device represented by a CCD (Charge Coupled Device) image sensor is known.

Figure 1:
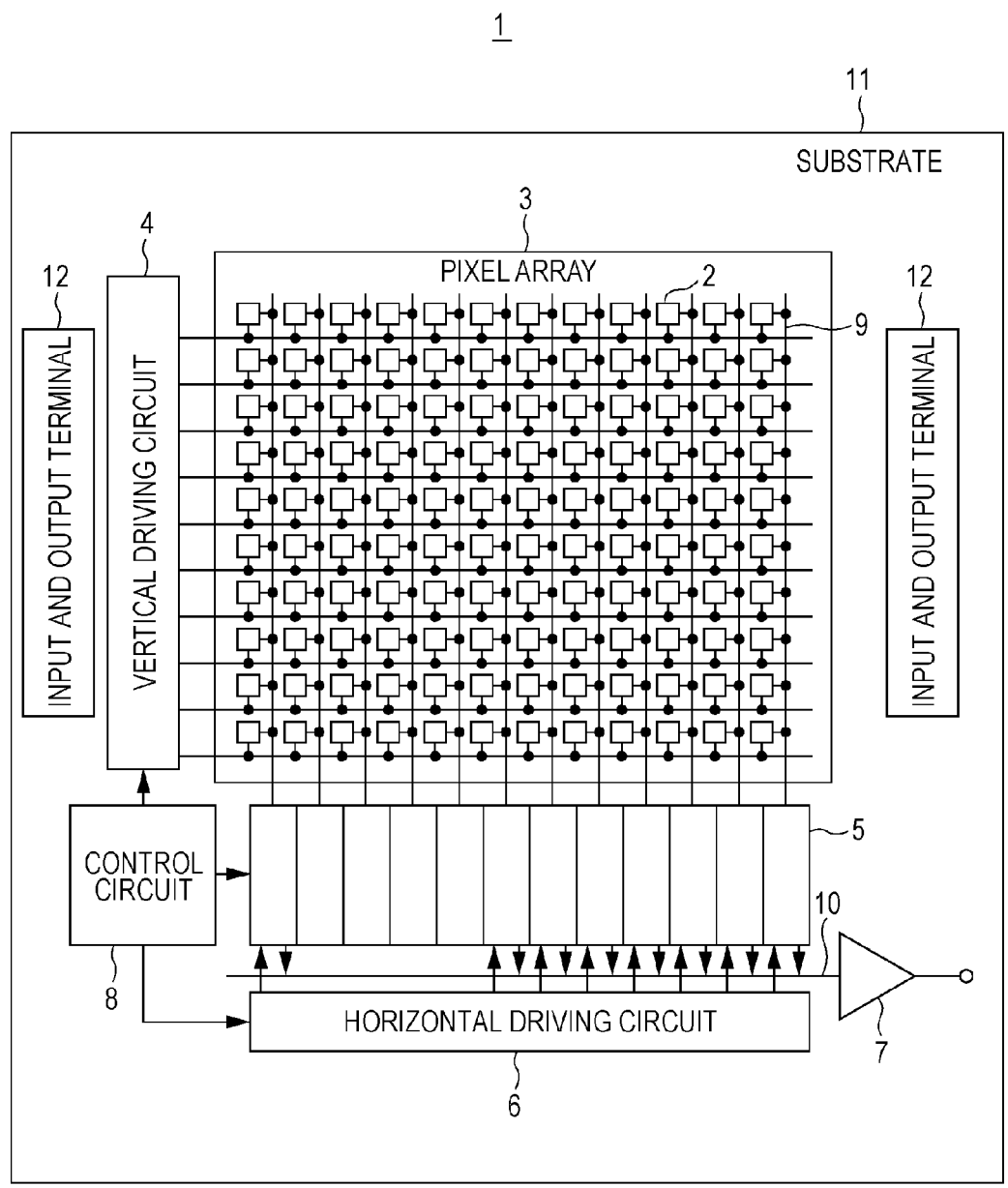
FIG. 1 is a diagram illustrating the entire configuration of a MOS solid-state imaging device.

FIG. 1 shows the entire configuration of a MOS solid-state imaging device as an example of a semiconductor device. A solid-state imaging device 1 shown in FIG. 1 includes a pixel region (so-called pixel array) 3 in which pixels 2 including a plurality of photoelectric conversion portions in a substrate 11, for example, a silicon substrate are regularly arranged in a two-dimensional array, and peripheral circuit portions. The pixel 2 includes, for example, a photodiode serving as a photoelectric conversion portion, and a plurality of pixel transistors (so-called MOS transistors). A plurality of pixel transistors can be composed of, for example, three transistors of a transfer transistor, a reset transistor and an amplifying transistor, and furthermore, can also be composed of four transistors in addition to a selection transistor. An equivalent circuit of a unit pixel is the same as usual, and thus a detailed description will be omitted. The pixel 2 can be formed as one unit pixel. In addition, the pixel 2 can also have a shared pixel structure. This shared pixel structure is composed of a plurality of photodiodes, a plurality of transfer transistors, one shared floating diffusion, and another one shared pixel transistor. That is, in the shared pixel, the photodiode and the transfer transistor composed of a plurality of unit pixels share another one pixel transistor.

The peripheral circuit portions include a vertical driving circuit 4, column signal processing circuits 5, a horizontal driving circuit 6, an output circuit 7, a control circuit 8, and the like.

The control circuit 8 receives data for instructing an input clock, an operation mode and the like, and outputs data such as internal information of the solid-state imaging device 1. That is, in the control circuit 8, a clock signal and a control signal serving as criteria of operations of the vertical driving circuit 4, the column signal processing circuit 5, the horizontal driving circuit 6, and the like are generated on the basis of a vertical synchronizing signal, a horizontal synchronizing signal and a master clock. These signals are input to the vertical driving circuit 4, the column signal processing circuits 5, the horizontal driving circuit 6, and the like.

The vertical driving circuit 4 is composed of, for example, shift registers, selects a pixel driving wiring line, supplies a pulse for driving pixels to the selected pixel driving wiring line, and drives the pixels sequentially for each column. That is, the vertical driving circuit 4 selectively scans each of the pixels 2 of the pixel region 3 sequentially in the vertical direction for each column, and supplies a pixel signal based on a signal charge generated in accordance with the amount of light received, for example, in a photodiode serving as a photoelectric conversion portion of each of the pixels 2, through vertical signal lines 9 to the column signal processing circuits 5.

The column signal processing circuits 5 are disposed, for example, for each column of the pixels 2, and perform signal processing such as denoising for each pixel column on a signal output from one row of pixels 2. That is, the column signal processing circuit 5 performs signal processing such as CDS (Correlated Double Sampling) for removing a fixed pattern noise intrinsic to the pixel 2, signal amplification, and analog to digital conversion. Horizontal selection switches (not shown) are connected between output stages of the column signal processing circuits 5 and a horizontal signal line 10.

The horizontal driving circuit 6 is composed of, for example, shift registers, selects each of the column signal processing circuits 5 in a sequence by sequentially outputting a horizontal scanning pulse, and outputs a pixel signal from each of the column signal processing circuits 5 to the horizontal signal line 10.

The output circuit 7 performs signal processing on a signal sequentially supplied from each of the column signal processing circuits 5 through the horizontal signal line 10 and then outputs the signal. For example, only buffering may be performed, and a black level adjustment, a column variation correction, various types of digital signal processing, and the like may be performed. An input and output terminal 12 performs an exchange of signals with the outside.

[Configuration (2) of MOS Solid-State Imaging Device]

In addition, in the above-mentioned MOS type solid-state imaging device, various solid-state imaging devices are proposed which have a configuration in which a semiconductor substrate including a pixel region where a plurality of pixels are arranged and a semiconductor substrate including a logic circuit for performing signal processing are electrically connected to each other to thereby form one device. FIG. 2 shows a basic schematic configuration of the MOS solid-state imaging device having such a configuration.

Figure 2A:
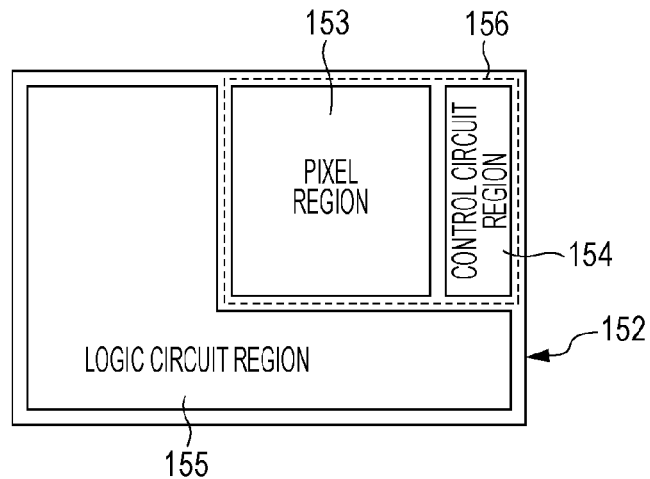
FIGS. 2A to 2C are diagrams illustrating the configuration of the MOS solid-state imaging device.

As shown in FIG. 2A, a general MOS solid-state imaging device 151 is configured such that a pixel region 153, a control circuit region 154, and a logic circuit region 155 for performing signal processing are mounted within one semiconductor substrate 152. Generally, as shown by the dashed line in the drawing, an image sensor 156 is composed of the pixel region 153 and the control circuit region 154.

Figure 2B:
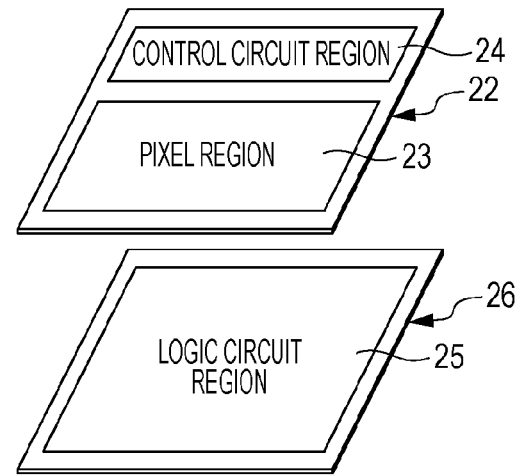

On the other hand, a MOS solid-state imaging device 21 shown in FIG. 2B is configured such that a pixel region 23 and a control circuit region 24 are mounted in a first semiconductor substrate 22, and a logic circuit region 25 including a signal processing circuit for performing signal processing is mounted in a second semiconductor substrate 26. The first semiconductor substrate 22 and the second semiconductor substrate 26 are electrically connected to each other, and the MOS solid-state imaging device 21 is formed as one semiconductor device.

Figure 2C:
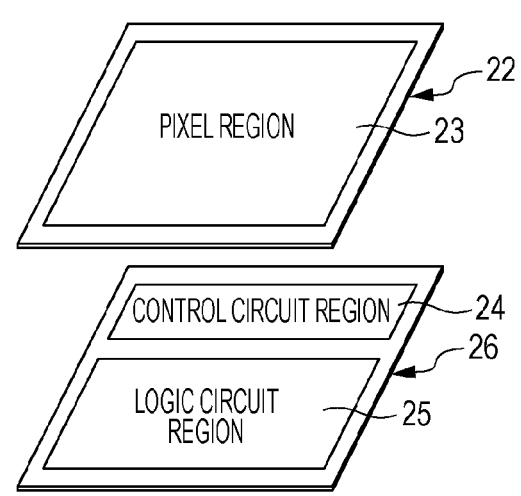

In addition, a MOS solid-state imaging device 27 shown in FIG. 2C is configured such that the pixel region 23 is mounted in the first semiconductor substrate 22, and the control circuit region 24 and the logic circuit region 25 including a signal processing circuit are mounted in the second semiconductor substrate 26. The first semiconductor substrate 22 and the second semiconductor substrate 26 are electrically connected to each other, and the MOS solid-state imaging device 27 is formed as one semiconductor device.

In the MOS solid-state imaging device 21 shown in FIG. 2B and the MOS solid-state imaging device 27 shown in FIG. 2C mentioned above, first, the first semiconductor substrate 22 and the second semiconductor substrate 26 are bonded to each other. Through-electrodes for connecting wiring layers formed in the first semiconductor substrate 22 and the second semiconductor substrate 26 are then formed.

Thereby, the first semiconductor substrate 22 and the second semiconductor substrate 26 are electrically connected to each other.

[Method of Bonding Semiconductor Substrates: Plasma Bonding]

Next, as an example of a method of bonding the first semiconductor substrate 22 and the second semiconductor substrate 26 mentioned above to each other, a plasma bonding method will be described. In bonding the semiconductor substrates, wiring layers are formed on the semiconductor substrates, and the bonding between the semiconductor substrates is performed by making forming surfaces of the wiring layers face each other.

In the plasma bonding method, plasma irradiation is performed on a layer made of $SiO_2$ or the like formed on a bonding surface of the semiconductor substrate, to form a silanol group (Si—OH group). The surfaces on which the silanol groups are formed are made to face each other, and a portion of the semiconductor substrate is pressed and is bonded by the van der Waals force. Thereafter, in order to further increase the adhesion of a bonded interface, for example, heat treatment of 400° C./60 min is performed and a dehydration condensation reaction is performed on the silanol groups. Such a control of the molecular level is performed on the bonding surface of the semiconductor substrate, thereby allowing the semiconductor substrates to be bonded to each other.

As stated above, in order to perform the control of the molecular level in the plasma bonding, planarization of the bonding surface is very important. For example, when there is a local level difference due to a conductor pattern and the like, it is difficult to bond the semiconductor substrates to each other by the plasma bonding. For this reason, the planarization of the bonding surface is performed using a CMP (Chemical Mechanical Polishing) method or the like.

In addition, when the wiring layer is formed on the semiconductor substrate, a warpage is generated in the semiconductor substrate due to the conductor layer for forming the wiring layer or the internal stress of an insulating layer.

When such a semiconductor substrate with the wiring layer having a warpage is bonded to a supporting substrate or the like having no warpage, the bonding thereof by the van der Waals force is possible using the plasma bonding without correcting the warpage of the semiconductor substrate. However, when the semiconductor substrates with the wiring layer having a warpage are bonded to each other, the influence of the warpage is not ignored, and it is difficult to perform a high-accuracy bonding by the plasma bonding.

For this problem, in the present disclosure, a technique capable of performing a high-accuracy bonding is provided in the semiconductor device in which the semiconductor substrates with wiring layers having a warpage are bonded to each other. Specifically, for the semiconductor substrate with the wiring layer having a warpage, a layer having a warpage reverse to the warpage of this semiconductor substrate is formed on the semiconductor substrate. That is, a layer having an internal stress reverse to the warpage of the semiconductor substrate with the wiring layer is formed on the semiconductor substrate. Hereinafter, the layer having an internal stress reverse to the warpage of this semiconductor substrate is called a warpage correction layer.

For example, the above-mentioned warpage correction layer is formed on the wiring layer formed in the semiconductor substrate, or, the surface on which the wiring layer of the semiconductor substrate is not formed. With this configuration, it is possible to easily correct the warpage of the semiconductor substrate. For this reason, for the semiconductor substrates in which the warpage is generated by the formation of the wiring layer, it is possible to perform bonding by easy and high-reliability plasma bonding.

Meanwhile, as a bonding method, a method used in the bonding between the semiconductor substrates can be applied in addition to the above-mentioned plasma bonding. For example, even when the semiconductor substrates are bonded to each other using an adhesive, it is possible to perform high-accuracy and high-reliability bonding by forming the above-mentioned warpage correction layer.

<2. First Embodiment of Semiconductor Device>

[Configuration Example of Solid-State Imaging Device]

Figure 3:
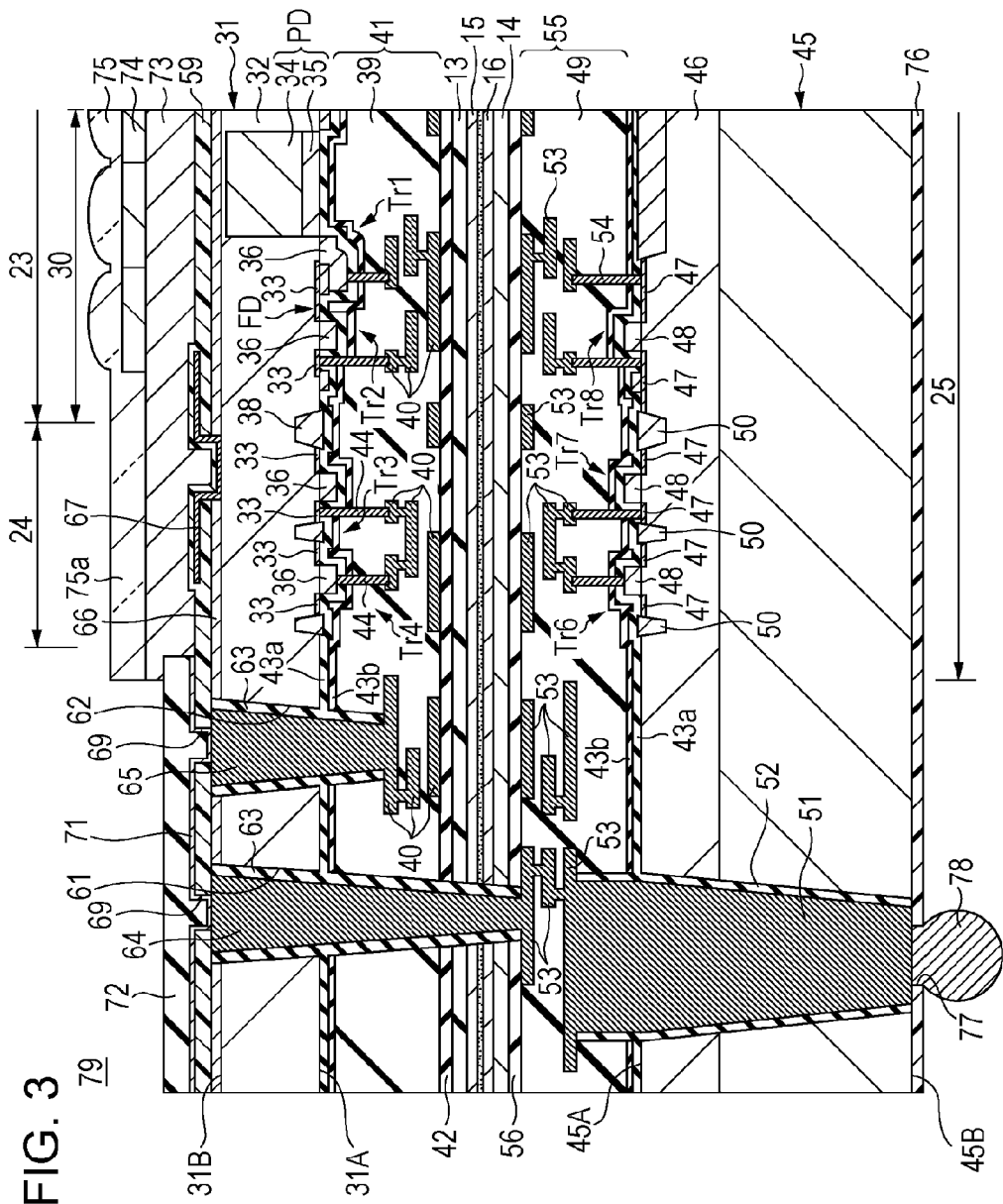
FIG. 3 is a cross-sectional view illustrating the configuration of a semiconductor device according to a first embodiment.

Hereinafter, a first embodiment of the semiconductor device according to the present disclosure will be described. FIG. 3 shows a configuration of a MOS solid-state imaging device 79 as an example of the semiconductor device of the first embodiment.

As shown in FIG. 3, the MOS solid-state imaging device 79 is configured such that a first semiconductor substrate 31 and a second semiconductor substrate 45 are bonded to each other by making a first main surface 31A side of the first semiconductor substrate 31 and a first main surface 45A side of the second semiconductor substrate 45 face each other. The first semiconductor substrate 31 includes the pixel region 23 in which a pixel array is formed and the control circuit region 24. The second semiconductor substrate 45 includes the logic circuit region 25. The MOS solid-state imaging device includes a through-electrode, passing through the first semiconductor substrate 31, which electrically connects a multilayer wiring layer 41 formed in the first semiconductor substrate 31 and a multilayer wiring layer 55 formed in the second semiconductor substrate 45 to each other.

(First Semiconductor Substrate)

The pixel region 23 of the first semiconductor substrate 31 includes a semiconductor well region 32 made of a first conductivity type, for example, a p-type semiconductor layer in a unit pixel 30. A photodiode (PD) serving as a photoelectric conversion portion of each of the pixels is included in the semiconductor well region 32. The photodiode (PD) includes a p-type semiconductor region 35 of the first semiconductor substrate 31 on the first main surface 31A side, and an n-type semiconductor region 34 formed below the p-type semiconductor region 35.

In addition, source/drain regions 33 of each pixel transistor are included in the semiconductor well region 32 of the first semiconductor substrate 31. The source/drain region 33 is made of a second conductivity type, for example, an n-type semiconductor layer.

In the pixel region 23, gate electrodes 36 are included on the first main surface 31A of the first semiconductor substrate 31 with a gate insulating film interposed therebetween. Pixel transistors Tr1 and Tr2 are formed by the gate electrode 36 and a pair of source/drain regions 33.

In the MOS solid-state imaging device 79 shown in FIG. 3, a plurality of pixel transistors are shown represented by two pixel transistors Tr1 and Tr2. The pixel transistor Tr1 adjacent to the photodiode (PD) is equivalent to a transfer transistor, and the source/drain region 33 is equivalent to a floating diffusion (FD).

In addition, each of the unit pixels 30 is separated by a separation region 38. The separation region 38 is formed by so-called LOCOS (local oxidation of silicon) or the like in which a silicon oxide film is formed by oxidizing the first semiconductor substrate 31. In addition, the separation region is formed by STI (Shallow Trench Isolation) in which a groove is opened within the first semiconductor substrate 31 and a silicon oxide film is buried in the groove, or a conductivity type impurity diffusion layer different from a diffusion layer serving as a node.

The control circuit region 24 of the first semiconductor substrate 31 includes a MOS transistor constituting a control circuit. In the MOS solid-state imaging device 79 shown in FIG. 3, the MOS transistor constituting the control circuit region 24 is shown represented by MOS transistors Tr3 and Tr4. Each of the MOS transistors Tr3 and Tr4 are formed by the n-type source/drain region 33, and the gate electrode 36 formed with a gate insulating film interposed therebetween.

In addition, the multilayer wiring layer 41 is formed on the first main surface 31A of the first semiconductor substrate 31.

The multilayer wiring layer 41 includes a first insulating layer 43a, a second insulating layer 43b, and an insulating interlayer 39 which are formed on the first main surface 31A of the first semiconductor substrate 31, and conductor layers 40 formed within the insulating interlayer 39 and connection conductors 44 formed within a connection hole of the insulating interlayer 39.

The first insulating layer 43a is made of, for example, a silicon oxide, and is formed over the entire surface of the first main surface 31A of the first semiconductor substrate 31 including the upper surface of a transistor. In addition, the second insulating layer 43b is made of, for example, a silicon nitride, and is formed on the first insulating layer 43a. The second insulating layer 43b serves as an etching stopper at the time of forming a connection hole connected to the gate electrode 36 or the source/drain region 33. The insulating interlayer 39 is made of, for example, a silicon oxide or the like, and is formed on the second insulating layer 43b.

The connection conductors 44 are made of a conductor buried in a connection hole connected to the gate electrode 36 or the source/drain region 33 formed in the insulating interlayer 39.

A plurality of conductor layers 40 are formed so as to be connected to each of the connection conductors 44 with the insulating interlayer 39 interposed therebetween. In this example, the multilayer wiring layer 41 is included in which three conductor layers 40 are formed. The conductor layers 40 and the connection conductors 44 are made of copper (Cu) or the like. For this reason, the conductor layers 40 and the connection conductors 44 are provided with a barrier metal, not shown, in order to prevent diffusion to an insulating layer.

In addition, a planarizing layer 42 for planarizing the level difference of the multilayer wiring layer 41 generated by the formation of the conductor layers 40 and the like is included on the multilayer wiring layer 41. The planarizing layer 42 has, for example, a laminated structure of a silicon oxide (HDP-SiO$_2$) using high-density plasma CVD (Chemical Vapor Deposition), a silicon oxide (P—SiO$_2$, P-TEOS) using plasma CVD and HDP-SiO$_2$, and a silicon oxide (P—SiO$_2$, P-TEOS or the like) using plasma CVD. Further, for example, the planarizing layer 42 may be formed using general coating materials such as SOG (Spin On Glass), SOD (Spin On Dielectric), and polyimide.

In addition, in the first semiconductor substrate 31, a warpage correction layer 13 is formed on the planarizing layer 42. A bonding layer 15 is formed on the warpage correction layer 13.

The warpage correction layer 13 is made of a layer having an internal stress reverse to the warpage of the first semiconductor substrate 31 in order to correct the warpage of the first semiconductor substrate 31 in which the multilayer wiring layer 41 is formed. The warpage correction layer 13 is formed using, for example, materials, capable of being formed by plasma CVD, such as SiN, SiO$_2$, SiOC, SiC, SiCN, FSG, and FTEOS, or materials, capable of being formed by a coating method, such as an organic material and SOG. Particularly, in a material layer in which the plasma CVD is used, the internal stress can be controlled by changing the conditions such as pressure within a chamber of the plasma CVD or RF power. For this reason, it is preferable that the material layer in which the plasma CVD is used be applied to the warpage correction layer 13.

The bonding layer 15 is a layer formed in the bonding surface in order to improve reliability of bonding between the first semiconductor substrate 31 and the second semiconductor substrate 45. When the first semiconductor substrate 31 and the second semiconductor substrate 45 are bonded to each other by the plasma bonding, for example, P—SiO$_2$, P—SiN, SiON, SiOC, SiOCH and the like are used. In addition, when the first semiconductor substrate 31 and the second semiconductor substrate 45 are bonded to each other by an adhesive, an existing adhesive used in the bonding between the semiconductor substrates or the bonding between the semiconductor substrate and the supporting substrate can be used.

In addition, a protective layer 66 is included on the entirety of the second main surface of the first semiconductor substrate 31. As the protective layer 66, for example, insulating materials including at least one or more elements selected from elements of silicon, hafnium, zirconium, aluminum, tantalum, titanium, yttrium, and lanthanoid are used. SiCN, P—SiN, SiC and the like are used.

Further, on the second main surface of the first semiconductor substrate 31, a light-shielding layer 67 is formed on a region to be shielded from light. In FIG. 3, the region to be shielded from light is schematically formed on the control circuit region 24. In the light-shielding layer 67, for example, tungsten or the like is used. The light-shielding layer 67 is electrically connected as, for example, a ground potential of the semiconductor well region 32, and thus it is possible to prevent the light-shielding layer 67 from being in an electrically floating state.

In addition, in the second main surface of the first semiconductor substrate 31, a passivation layer 59 is included over the entire surface of the protective layer 66. The light-shielding layer 67 is covered with the passivation layer 59. As the passivation layer 59, for example, P—SiON, P—SiN or the like is used.

In addition, a planarizing layer 73 is formed on the second main surface of the first semiconductor substrate 31. An on-chip color filter 74 of, for example, red (R), green (G), and blue (B) is included on the planarizing layer 73, corresponding to each of the pixels. An on-chip color microlens 75 is included on the on-chip color filter 74. Each of the on-chip color filter 74 and the on-chip color microlens 75 is formed corresponding to each unit pixel of the pixel array.

(Second Semiconductor Substrate)

The second semiconductor substrate 45 includes the logic circuit region 25 including a signal processing circuit for performing signal processing.

A plurality of MOS transistors constituting a logic circuit are included in a p-type semiconductor well region 46 formed on the first main surface 45A side of the second semiconductor substrate 45. In the MOS solid-state imaging device 79 shown in FIG. 3, a plurality of MOS transistors formed on the first main surface 45A of the second semiconductor substrate 45 are represented by MOS transistors Tr6, Tr7, and Tr8. Each of the MOS transistors Tr6, Tr7, and Tr8 is separated by a separation region 50, and has a pair of n-type source/drain regions 47 and a gate electrode 48 formed with a gate insulating film interposed therebetween, respectively. As shown in FIG. 3, the logic circuit region 25 is composed of CMOS transistors.

In addition, the multilayer wiring layer 55 is included on the first main surface 45A of the second semiconductor substrate 45.

The multilayer wiring layer 55 includes the first insulating layer 43a, the second insulating layer 43b, and an insulating interlayer 49 which are formed on the first main surface 45A of the second semiconductor substrate 45, conductor layers 53 formed within the insulating interlayer 49, and connection conductors 54 formed within a connection hole in the insulating interlayer 49.

The first insulating layer 43a is made of, for example, a silicon oxide, and is formed over the entire surface of the first main surface 45A of the second semiconductor substrate 45 including the upper surface of a transistor. In addition, the second insulating layer 43b is made of, for example, a silicon nitride, and is formed on the first insulating layer 43a. The second insulating layer 43b serves as an etching stopper at the time of forming a connection hole connected to the gate electrode 48 or the source/drain region 47. The insulating interlayer 49 is made of, for example, a silicon oxide or the like, and is formed on the second insulating layer 43b.

The connection conductors 54 are made of a conductor buried in a connection hole connected to the gate electrode 48 or the source/drain region 47 formed in the insulating interlayer 49. A plurality of conductor layers 53 are formed so as to be connected to each of the connection conductors 54 with the insulating interlayer 49 interposed therebetween. In this example, the multilayer wiring layer 55 is included in which three conductor layers 53 are formed.

In addition, a connection hole passing through the second semiconductor substrate 45 from the conductor layers 53 of the multilayer wiring layer 55 is formed at a predetermined position of the second semiconductor substrate 45, and an insulating layer 52 is formed inside this connection hole. A connection conductor 51 for a take-off electrode is formed within a connection hole covered with the insulating layer 52. As the conductor layers 53 and the connection conductors 51 and 54, for example, copper (Cu), tungsten (W), polysilicon or the like is used. In addition, a barrier metal, not shown, is provided between the conductor layers 53 and the connection conductors 51 and 54, and the insulating layer, in order to prevent diffusion to the insulating layer.

The second semiconductor substrate 45 includes a passivation layer 76 over the entire surface of the second main surface 45B. An opening 77 is formed in the passivation layer 76, and the connection conductor 51 is exposed from this opening 77. A spherical electrode bump 78 electrically connected to the connection conductor 51 is formed on the exposed surface of the connection conductor 51. With this configuration, the connection conductor 51 serves as a take-off electrode.

A planarizing layer 56 for planarizing the level difference generated in the multilayer wiring layer 55 by the formation of the conductor layers 53 and the like is included on the multilayer wiring layer 55. The planarizing layer 56 has, for example, a laminated structure of a silicon oxide (HDP-$SiO_2$) using high-density plasma CVD (Chemical Vapor Deposition), a silicon oxide (P—$SiO_2$, P-TEOS) using plasma CVD, and HDP-$SiO_2$, and a silicon oxide (P—$SiO_2$, P-TEOS or the like) using plasma CVD. Further, for example, the planarizing layer 56 may be formed using general coating materials such as SOG (Spin On Glass), SOD (Spin On Dielectric), and polyimide.

In addition, in the second semiconductor substrate 45, a warpage correction layer 14 is formed on the planarizing layer 56. A bonding layer 16 is formed on the warpage correction layer 14.

The warpage correction layer 14 is made of a layer having an internal stress reverse to the warpage of the second semiconductor substrate 45 in order to correct the warpage of the second semiconductor substrate 45 in which the multilayer wiring layer 55 is formed. The warpage correction layer 14 can have the same configuration as that of the warpage correction layer 13 formed in the first semiconductor substrate 31 mentioned above. In addition, the bonding layer 16 can also have the same configuration as that of the bonding layer 15 formed in the first semiconductor substrate 31 mentioned above.

(Through-Electrode)

A through-electrode is formed outside the regions of the pixel region 23 and the control circuit region 24 of the first semiconductor substrate 31, and is connected from the second main surface 31B side of the first semiconductor substrate 31 to the conductor layers 53 of the multilayer wiring layer 55 of the second semiconductor substrate 45.

The through-electrode is composed of an insulating layer 63 and a connection conductor 64 formed within a through-connection hole 61. The through-connection hole 61 passes through the first semiconductor substrate 31, the multilayer wiring layer 41, the planarizing layer 42, the warpage correction layer 13, and the bonding layer 15, and further passes through the bonding layer 16, the warpage correction layer 14, and the planarizing layer 56 on the second semiconductor substrate 45.

In addition, the first semiconductor substrate 31 includes a connection electrode, extending from the second main surface 31B side to the conductor layers 40 of the multilayer wiring layer 41, outside the regions of the pixel region 23 and the control circuit region 24. This connection electrode passes through the first semiconductor substrate 31 from the second main surface 31B, and is composed of a connection hole 62 extending from the second main surface 31B side to the conductor layers 40 of the multilayer wiring layer 41, and the insulating layer 63 and a connection conductor 65 formed within this connection hole 62.

In the second main surface of the first semiconductor substrate 31, a connection hole 69 is formed in the passivation layer 59 corresponding to the connection conductor 64 and the connection conductor 65. A barrier metal layer 71 and a connection wiring line 72 which cover the connection conductor 64, the connection conductor 65, and the connection hole 69 are formed. The connection wiring line 72 is formed of, for example, aluminum. In addition, the barrier metal layer 71 is formed of, for example, a laminated body of Ti/TiN.

The connection wiring line 72 is connected to the connection conductor 64 and the connection conductor 65 through the through-connection hole 61. This connection wiring line 72 is used in the connection of the pixel region 23 and the control circuit region 24 to the logic circuit region 25, and serves as a take-off electrode from the upper surface, so-called an electrode pad.

The image sensor of the pixel region 23 and the control circuit region 24 formed in the first semiconductor substrate 31, and the logic circuit region 25 formed in the second semiconductor substrate 45 are electrically connected to each other by the connection conductor 65, the connection wiring line 72 and the connection conductor 64 mentioned above.

As described above, the semiconductor device of the embodiment is formed based on the backside-illumination type MOS solid-state imaging device 79. The MOS solid-state imaging device 79 is configured such that the first semiconductor substrate 31 and the second semiconductor substrate 45 are bonded to each other in the bonding layer 15 and the bonding layer 16 which are formed on the wiring layer forming surface side. The warpage correction layers 13 and 14 are formed on the first main surface 31A side of the first semiconductor substrate 31 and the first main surface 45A side of the second semiconductor substrate 45, respectively.

In the above-mentioned embodiment, the warpage correction layers 13 and 14 are formed on the first main surface 31A side of the first semiconductor substrate 31 and the first main surface 45A side of the second semiconductor substrate 45, but the formation positions of the warpage correction layers 13 and 14 are not limited thereto. For example, when the first semiconductor substrate 31 and the second semiconductor substrate 45 are bonded to each other by the plasma bonding, and at least any one of the warpages of the first semiconductor substrate 31 and the second semiconductor substrate 45 is corrected, the bonding is possible. For this reason, the warpage correction layer is preferably formed on at least one or more of the first main surface 31A side and the second main surface 31B of the first semiconductor substrate 31, and, the first main surface 45A side and the second main surface 45B side of the second semiconductor substrate 45. The warpage of any one substrate of the first semiconductor substrate 31 and the second semiconductor substrate 45 is corrected by forming the warpage correction layer, and thus even when the other substrate has a warpage, it is possible to perform the bonding by the plasma bonding.

Further, in the above-mentioned backside-illumination type MOS solid-state imaging device 79, a light sensing surface of the photodiode PD, the on-chip color filter 74 and the on-chip color microlens 75 are formed on the second main surface 31B side of the first semiconductor substrate 31. For this reason, it is difficult to form the warpage correction layer on this surface.

Therefore, it is preferable that the warpage correction layer be formed on at least one or more of the first main surface 31A side of the first semiconductor substrate 31, the first main surface 45A side of the second semiconductor substrate 45, and the second main surface 45A side of the second semiconductor substrate 45.

In addition, in the above-mentioned backside-illumination type MOS solid-state imaging device 79, a through-electrode connected from the second main surface 31B of the first semiconductor substrate 31 to the multilayer wiring layer 55 of the second semiconductor substrate 45 is formed. For this reason, when the warpage correction layers are formed on the first main surface 31A side of the first semiconductor substrate 31 and the first main surface 45A side of the second semiconductor substrate 45, the aspect ratio of the through-connection hole 61 becomes large, and thus coatability of the insulating layer 63 or the connection conductor 64 is lowered.

Further, when the through-connection hole 61 of the through-electrode is formed, a hole also has to be formed in the warpage correction layer, in addition to the first semiconductor substrate 31 and the insulating interlayer 39. Since each of the layers is formed by materials different from each other, the conditions for forming the through-connection hole 61 are different. For this reason, when the warpage correction layers are formed on the first main surface 31A side of the first semiconductor substrate 31 and the first main surface 45A side of the second semiconductor substrate 45, the through-connection hole 61 becomes complicated.

Therefore, form the viewpoint of forming the through-electrode, it is preferable that the warpage correction layer be formed in the second main surface side of the second semiconductor substrate 45 rather than the bonding surface of the first semiconductor substrate 31 and the second semiconductor substrate 45.

In addition, in the plasma bonding, the bonding can be performed when there is no warpage in one substrate. However, in order to increase the bonding accuracy, it is preferable that there is no warpage in both substrates to be bonded. For this reason, from the viewpoint of the bonding accuracy, as in the above-mentioned embodiment, it is preferable that the warpage correction layers be formed on the first main surface side of the first semiconductor substrate and the first main surface side of the second semiconductor substrate, or are formed on the first main surface side of the first semiconductor substrate and the second main surface side of the second semiconductor substrate.

<3. Method of Manufacturing Semiconductor Device of First Embodiment>

[Method of Manufacturing Solid-State Imaging Device]

Next, a method of manufacturing the MOS solid-state imaging device of the embodiment mentioned above will be described with reference to FIGS. 4 to 11.

(First Semiconductor Substrate)

Figure 4:
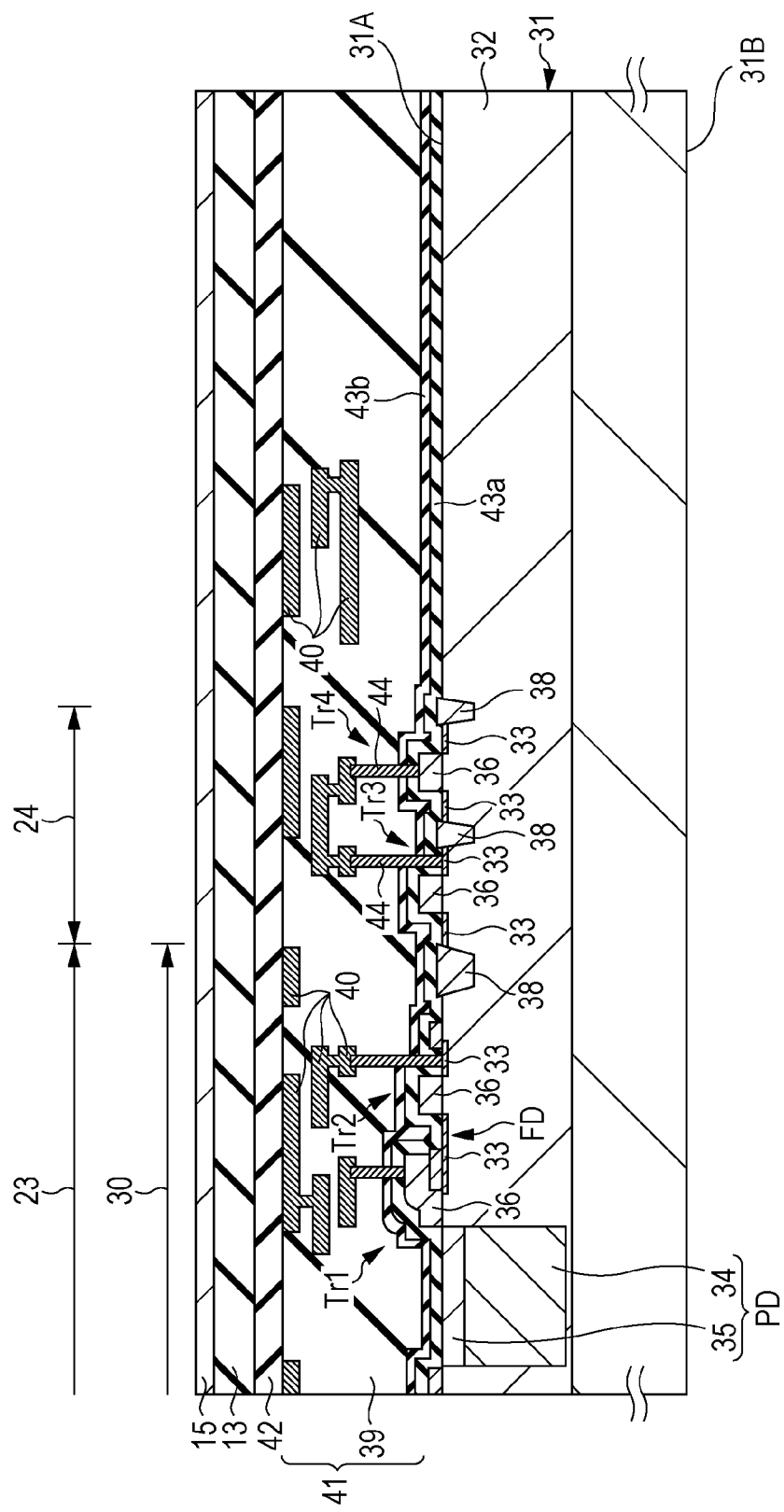
FIG. 4 is a diagram illustrating a method of manufacturing the semiconductor device according to the first embodiment.

First, as shown in FIG. 4, a first conductivity type, for example, a p-type impurity is introduced into the pixel region 23 of the first semiconductor substrate 31 to form the semiconductor well region 32. The photodiode (PD) serving as a photoelectric conversion portion of each pixel and the source/drain region 33 of each pixel transistor are formed in the semiconductor well region 32. The photodiode (PD) is formed of the n-type semiconductor region 34 and the p-type semiconductor region 35 on the substrate surface side. The source/drain region 33 is formed in a predetermined region of the first semiconductor substrate 31 on the first main surface 31A by introducing a second conductivity type, for example, an n-type impurity. The photodiode (PD) and the source/drain region 33 of each pixel transistor are formed by ion implantation from the substrate surface.

The gate electrode 36 is formed on the substrate surface constituting the pixels with a gate insulating film interposed therebetween, and the pixel transistors Tr1 and Tr2 are formed by the gate electrode 36 and a pair of source/drain regions 33.

Simultaneously, the MOS transistors Tr3 and Tr4 constituting a control circuit in the first semiconductor substrate 31 are formed in the control circuit region 24 of the first semiconductor substrate 31. Each of the MOS transistors Tr3 and Tr4 is formed by the n-type source/drain region 33, and the gate electrode 36 formed with a gate insulating film interposed therebetween.

In addition, the separation regions 38 that separate each of the unit pixels 30 are formed. As the separation region 38, so-called LOCOS is formed in which a silicon oxide film is formed by oxidizing the first main surface 31A side of the first semiconductor substrate 31. In addition, STI (Shallow Trench Isolation) in which a groove is opened within the first semiconductor substrate 31 and a silicon oxide film is buried in the groove, or a conductivity type impurity diffusion layer different from a diffusion layer serving as a node may be formed as the separation region 38, instead of LOCOS.

Next, in the first main surface 31A side of the first semiconductor substrate 31, the first insulating layer 43*a* is formed of, for example, a silicon oxide over the entire surface including the upper surface of a transistor. The second insulating layer 43*b* is formed of, for example, a silicon nitride on the first insulating layer 43*a*. Further, the insulating interlayer 39 is formed on the second insulating layer 43*b*.

Next, connection holes are formed in the insulating interlayer 39, and the connection conductors 44 connected to necessary transistors are formed. The connection holes are selectively formed at the positions connected to the necessary transistors in the insulating interlayer 39. Connection holes having different depths are formed by selectively etching the first insulating layer 43*a* and the second insulating layer 43*b* so as to be continuous with each of the connection holes. In the etching when the connection holes are formed, the second insulating layer 43*b* is used as an etching stopper. Thereby, it is possible to easily form the connection holes having different depths.

Next, the connection conductor 44 is buried in each of the connection holes. A plurality of layers, in this example, three conductor layers 40 are formed so as to be connected to each of the connection conductors 44 with the insulating interlayer 39 interposed therebetween, to form the multilayer wiring layer 41. The conductor layers 40 are formed of, for example, copper (Cu). When the conductor layers 40 are formed of copper, generally, a barrier metal layer for preventing Cu diffusion is formed between the conductor layers 40 and the insulating interlayer 39.

Next, the planarizing layer 42 is formed on the multilayer wiring layer 41. The multilayer wiring layer 41 has a level difference generated when the conductor layers 40 and the like are formed on the multilayer wiring layer 41. For this reason, a layer for planarizing this level difference is formed. For example, a silicon oxide (HDP-SiO$_2$) layer using high-density plasma CVD (Chemical Vapor Deposition) is formed on the planarizing layer 42. Further, a silicon oxide (P—SiO$_2$) layer using plasma CVD is formed on the HDP-SiO$_2$ layer, as necessary. In addition, only a silicon oxide (P—SiO$_2$, P-TEOS or the like) layer using plasma CVD may be formed. The surface is planarized by polishing the formed silicon oxide layer using a CMP method. Further, the planarizing layer 42 may be formed using, for example, general coating materials such as SOG (Spin On Glass), SOD (Spin On Dielectric), and polyimide.

Next, the warpage correction layer 13 for correcting the warpage of the first semiconductor substrate 31 in which the multilayer wiring layer 41 is formed is formed on the planarizing layer 42. The warpage correction layer 13 is configured such that a layer having an internal stress reverse to the warpage of the substrate is formed in order to correct the warpage of the first semiconductor substrate 31 in which the multilayer wiring layer 41 is formed. The warpage correction layer is formed using materials, capable of being formed by the plasma CVD, such as, for example, SiN, SiO$_2$, SiOC, SiC, SiCN, FSG, and FTEOS, or materials, capable of being formed by a coating method, such as an organic material and SOG. In particular, the plasma CVD is preferable because the internal stress of the warpage correction layer 13 can be controlled by changing the conditions such as a pressure within a chamber or RF power.

The amount of warpage correction of the first semiconductor substrate 31 is determined by measuring the amount of warpage of the substrate immediately before the correction, and converting the amount of correction in which the amount of warpage in a subsequent process is previously incorporated from the thickness and the internal stress of the warpage correction layer 13. The amount of warpage of the first semiconductor substrate 31 can be measured using an existing film stress measuring device and a stress measuring device.

In this correction method, the amount of correction of the semiconductor substrate can be managed immediately before the bonding between the semiconductor substrates. For this reason, this correction method is a superior method capable of coping with various wiring line patterns or wiring layers.

Next, the bonding layer 15 is formed on the warpage correction layer 13. The bonding layer 15 is a layer which is formed in order to bond the first semiconductor substrate 31 and the second semiconductor substrate 45 to each other.

When the first semiconductor substrate 31 and the second semiconductor substrate 45 are bonded to each other by the plasma bonding, a material layer of approximately 100 to 2,000 nm, capable of performing the plasma bonding and the CMP, such as, for example, P—SiO$_2$, P—SiN, P—SiON, SiOC, and SiOCH is formed. The surface of the bonding layer 15 is polished using a CMP method so as to have surface roughness necessary to the plasma bonding.

In addition, when the first semiconductor substrate 31 and the second semiconductor substrate 45 are bonded to each other by an adhesive, the bonding layer 15 is formed using an existing adhesive used in the bonding between the semiconductor substrates, or the bonding between the semiconductor substrate and the supporting substrate.

(Second Semiconductor Substrate)

Figure 5:
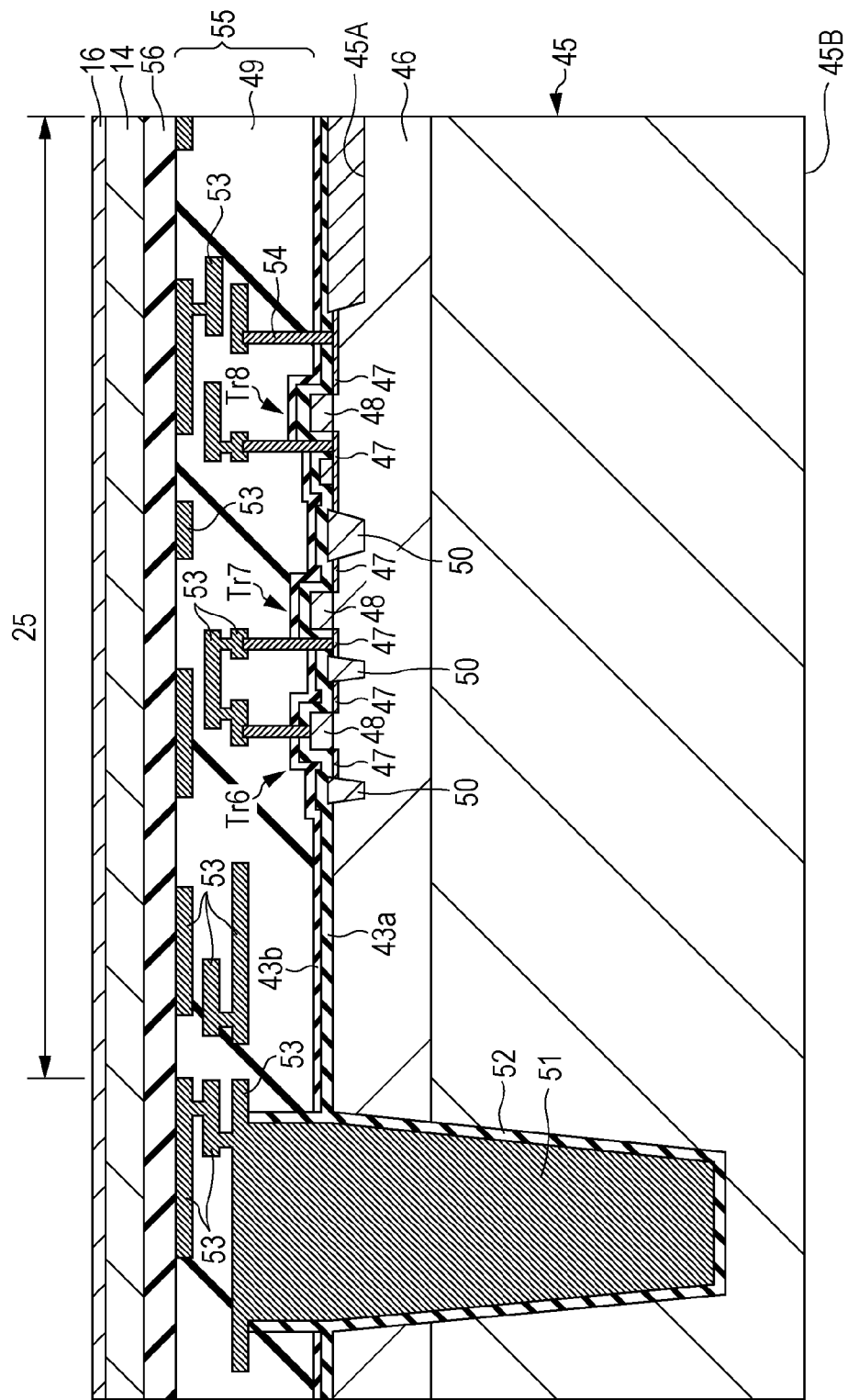
FIG. 5 is a diagram illustrating the method of manufacturing the semiconductor device according to the first embodiment.

Next, as shown in FIG. 5, the logic circuit region 25 including a signal processing circuit that performs signal processing is formed in the second semiconductor substrate 45.

First, the semiconductor well region 46 is formed on the first main surface 45A side of the second semiconductor substrate 45 by introducing a first conductivity type, for example, a p-type impurity. The separation regions 50 and a plurality of MOS transistors Tr6, Tr7, and Tr8 which are separated by the separation regions 50 and constitute a logic circuit are formed in the semiconductor well region 46. Each of the MOS transistors Tr6, Tr7, and Tr8 is respectively formed of a pair of n-type source/drain regions 47, and the gate electrode 48 formed with a gate insulating film interposed therebetween. In this manner, the logic circuit region 25 is composed of CMOS transistors.

In the separation region 50, so-called LOCOS in which a silicon oxide film is formed by oxidizing the first main surface 45A side of the second semiconductor substrate 45 is formed. In addition, STI (Shallow Trench Isolation) in which a groove is opened within the second semiconductor substrate 45 and a silicon oxide film is buried in the groove, or a conductivity type impurity diffusion layer different from a diffusion layer serving as a node may be formed as the separation region 50, instead of LOCOS.

The source/drain regions 47 are formed in predetermined regions of the second semiconductor substrate 45 on the first main surface 45A side by introducing a second conductivity type, for example, an n-type impurity.

Next, on the first main surface of the second semiconductor substrate 45, the first insulating layer 43*a* is formed of, for example, a silicon oxide over the entire surface including the upper surface of the CMOS transistor. The second insulating layer 43*b* is formed of, for example, a silicon nitride on the first insulating layer 43a. Further, the insulating interlayer 49 is formed on the second insulating layer 43b.

Next, connection holes are formed in the insulating interlayer 49, and the connection conductors 54 connected to necessary transistors are formed. The connection holes are selectively formed at the positions connected to the necessary transistors in the insulating interlayer 49. Connection holes having different depths are formed by selectively etching the first insulating layer 43a and the second insulating layer 43b having the same thickness in each portion so as to be continuous with each of the connection holes. In the etching when the connection holes are formed, the second insulating layer 43b is used as an etching stopper, thereby allowing the connection holes having different depths to be easily formed.

After the connection holes are formed, the connection conductors 54 are buried in each of the connection holes.

In addition, a connection hole extending from the surface of the insulating interlayer 49 to a desired depth position within the second semiconductor substrate 45 is formed in a predetermined position of the second semiconductor substrate 45. The insulating layer 52 is then formed in the inner wall of this connection hole. The connection conductor 51 for a take-off electrode is buried in the connection hole in which the insulating layer 52 is formed. This connection conductor 51 is formed of, for example, copper (Cu), tungsten (W), polysilicon or the like.

In order to be connected to each of the connection conductors 54 and the connection conductor 51 for a take-off electrode, a plurality of layers, in this example, three conductor layers 53 are formed with the insulating interlayer 49 interposed therebetween, to form the multilayer wiring layer 55.

Next, the planarizing layer 56 is formed on the multilayer wiring layer 55. Since the multilayer wiring layer 55 has a level difference generated when the conductor layers 53 and the like of the multilayer wiring layer 55 are formed, it is necessary to form a layer for planarizing this level difference. For example, a silicon oxide (HDP-SiO$_2$) layer using high-density plasma CVD (Chemical Vapor Deposition) is formed on the planarizing layer 56. Further, a silicon oxide (P—SiO$_2$) layer using plasma CVD is formed on the HDP-SiO$_2$ layer, as necessary. In addition, only a silicon oxide (P—SiO$_2$, P-TEOS or the like) layer using plasma CVD may be formed. The surface is planarized by polishing the formed silicon oxide layer using a CMP method. Further, the planarizing layer 42 may be formed using, for example, general coating materials such as SOG (Spin On Glass), SOD (Spin On Dielectric), and polyimide.

Next, in order to correct the warpage of the second semiconductor substrate 45 in which the multilayer wiring layer 55 is formed, the warpage correction layer 14 is formed on the planarizing layer 56. Similarly to the warpage correction layer 13 of the first semiconductor substrate 31 mentioned above, the warpage correction layer 14 is configured such that a layer having an internal stress reverse to the warpage of the substrate is formed in order to correct the warpage of the second semiconductor substrate 45 in which the multilayer wiring layer 55 is formed.

The warpage correction layer 14 is formed of materials, capable of being formed by the plasma CVD, such as, for example, SiN, SiO$_2$, SiOC, SiC, SiCN, FSG, and FTEOS, or materials, capable of being formed by a coating method, such as an organic material and SOG. In particular, the plasma CVD is preferable because the internal stress of the warpage correction layer 14 can be controlled by changing the film formation conditions such as a pressure within a chamber or RF power. The material of the warpage correction layer 14 may be the same as that of the warpage correction layer 13 of the first semiconductor substrate 31 mentioned above, and may be different therefrom.

In addition, the amount of warpage correction is determined by the warpage correction layer 14 by previously measuring the amount of warpage of the second semiconductor substrate 45 in which the multilayer wiring layer 55 is formed, and previously incorporating the amount of warpage of the substrate in a subsequent process, and converting the amount from the thickness and the internal stress of the warpage correction layer 14. The amount of warpage of the second semiconductor substrate 45 is measured using an existing film stress measuring device and a stress measuring device.

Next, the bonding layer 16 is formed on the warpage correction layer 14.

When the first semiconductor substrate 31 and the second semiconductor substrate 45 are bonded to each other by the plasma bonding, similarly to the first semiconductor substrate 31, a material layer, capable of performing the plasma bonding and the CMP, such as, for example, P—SiO$_2$, P—SiN, SiON, SiOC, and, SiOCH is formed. The surface of the bonding layer 16 is polished using a CMP method so as to have surface roughness necessary to the plasma bonding.

In addition, when the first semiconductor substrate 31 and the second semiconductor substrate 45 are bonded to each other by an adhesive, the bonding layer 16 is formed using an existing adhesive used in the bonding between the semiconductor substrates, or the bonding between the semiconductor substrate and the supporting substrate.

The first semiconductor substrate 31 before the bonding is formed with the pixel region 23 and the control circuit region 24 shown in FIG. 4 by the above-mentioned processes. In addition, the second semiconductor substrate 45 before the bonding is formed with the logic circuit region 25 shown in FIG. 5.

(Bonding)

Figure 6:
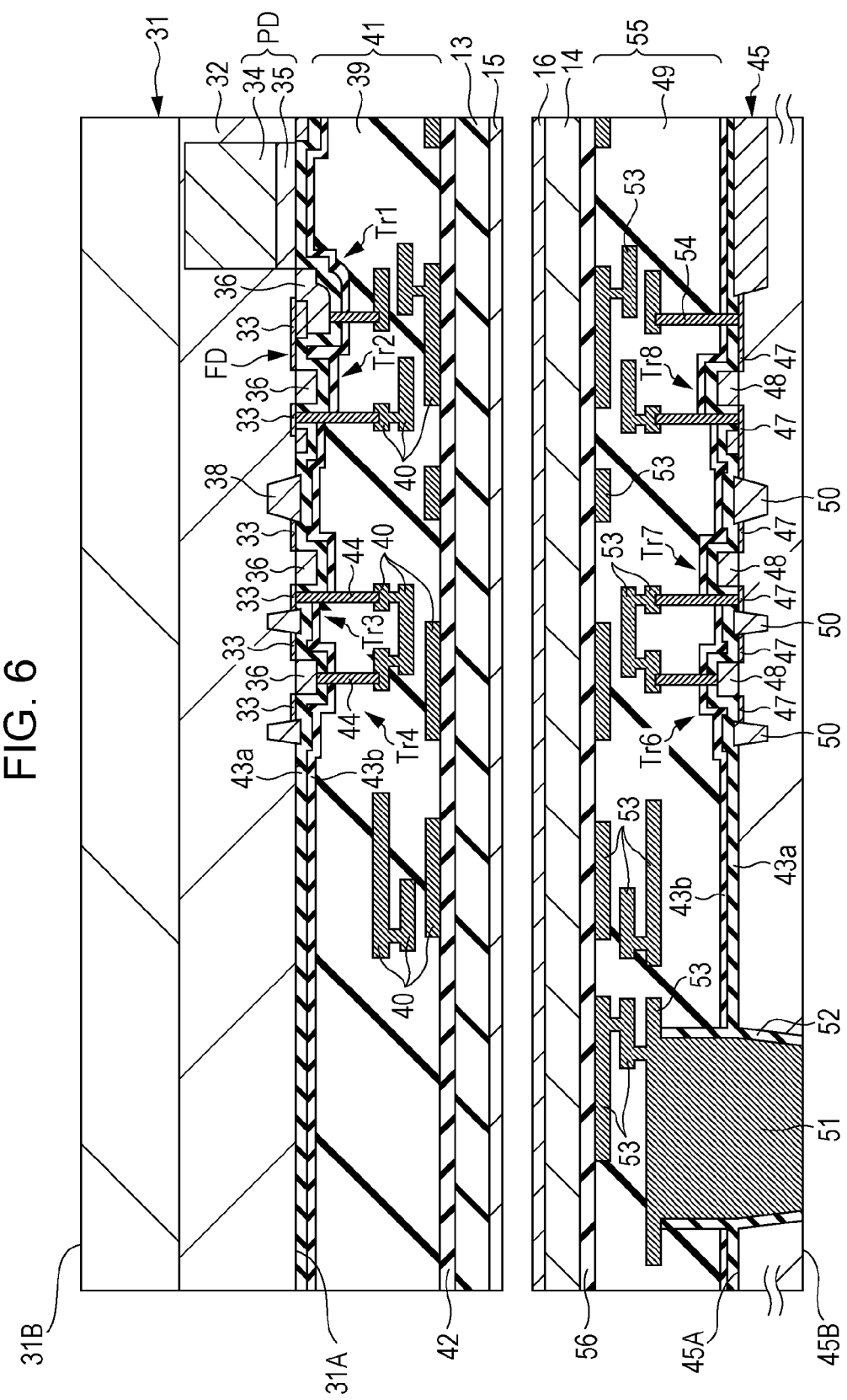
FIG. 6 is a diagram illustrating the method of manufacturing the semiconductor device according to the first embodiment.

Next, as shown in FIG. 6, the first semiconductor substrate 31 and the second semiconductor substrate 45 are bonded to the first main surfaces 31A and 45A. The bonding is performed using, for example, a plasma bonding method.

First, the surface bonding layer 15 of the first semiconductor substrate 31 and the surface of the bonding layer 16 of the second semiconductor substrate 45 are irradiated with oxygen plasma, for example, for 60 seconds, at a frequency of 13.56 MHz, a pressure of 10 Pa, and a power of 100 W, and the surfaces thereof are reformed. After reforming, the surface of the bonding layer 15 of the first semiconductor substrate 31 and the surface of the bonding layer 16 of the second semiconductor substrate 45 are cleaned for 30 seconds with pure water of 18 MΩ or more. Silanol groups (Si—OH groups) are formed on the surfaces of the bonding layers 15 and 16 by this process.

Next, the first semiconductor substrate 31 and the second semiconductor substrate 45 are caused to face each other so that the bonding layers 15 and 16 face each other, and a portion of the first semiconductor substrate 31 or the second semiconductor substrate 45 is pressed down by a pin. Thereby, the first semiconductor substrate 31 and the second semiconductor substrate 45 are thoroughly bonded to each other by the van der Waals force of the bonding surface. Thereafter, heat treatment of 400° C. is performed under a nitrogen atmosphere of an atmospheric pressure for 60 minutes, whereby the silanol groups on the surfaces of the bonding layers 15 and 16 are dehydrated and synthesized with each other, and the bonding in the molecular level is performed.

In addition, an adhesive can also be used in the bonding of the first semiconductor substrate 31 to the second semiconductor substrate 45. When the bonding is performed using an adhesive, an adhesive layer is formed on at least one of the bonding layers 15 and 16 of the first semiconductor substrate 31 and the second semiconductor substrate 45, and the bonding is performed through this adhesive layer.

In the above-mentioned bonding between the semiconductor substrates, the warpages of the first semiconductor substrate 31 and the second semiconductor substrate 45 due to the internal stress of the multilayer wiring layers 41 and 55 are corrected by forming the warpage correction layers 13 and 14. For this reason, it is possible to improve the bonding reliability and to perform the high-accuracy bonding, in the bonding between the semiconductor substrates.

(Grinding of Second Main Surface)

Figure 7:
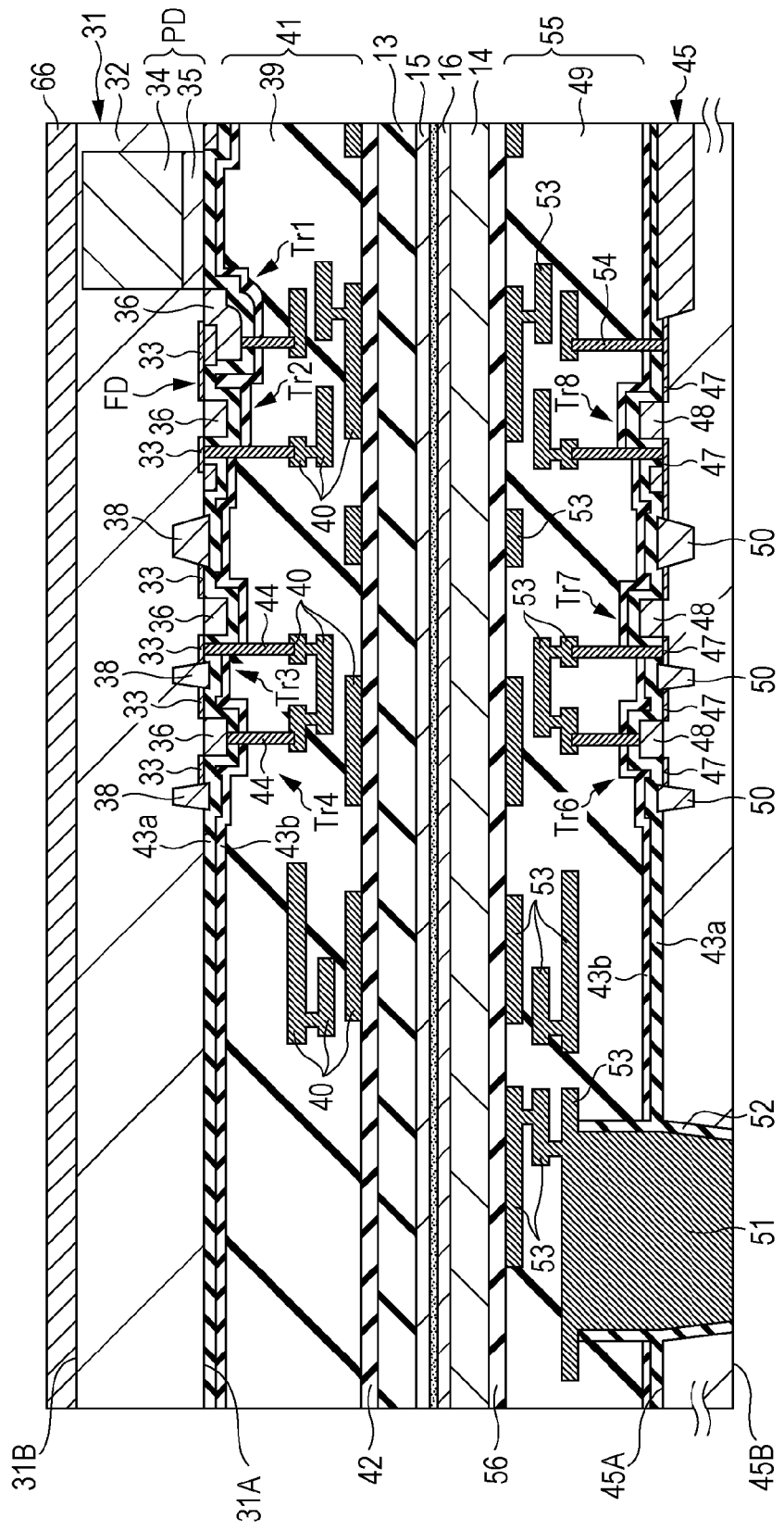
FIG. 7 is a diagram illustrating the method of manufacturing the semiconductor device according to the first embodiment.

Next, as shown in FIG. 7, the first semiconductor substrate 31 is thinned by performing grinding and polishing from the second main surface 31B side of the first semiconductor substrate 31. The thinning is performed up to the position approaching the photodiode (PD) from the second main surface 31B side of the first semiconductor substrate 31.

After the thinning, a p-type semiconductor layer, not shown, for dark current suppression is formed in the photodiode (PD) on the second main surface 31B side of the first semiconductor substrate 31. The thickness of the first semiconductor substrate 31 before the thinning is, for example, approximately 600 µm, but is set to, for example, 1 µm to 10 µm, preferably approximately 1 µm to 5 µm by the thinning process.

In addition, after the thinning, the protective layer 66 is formed over the entire backside of the first semiconductor substrate 31. The protective layer 66 is formed of, for example, SiCN, P—SiN, SiC or the like.

The second main surface 31B of the first semiconductor substrate 31 is formed as a light incident surface of the backside-illumination type MOS solid-state imaging device 79.

In the past, the thinning of the first semiconductor substrate 31 in which the pixel region is formed has been performed by bonding thereof to a supporting substrate separately prepared. On the other hand, in the embodiment, the thinning process of the first semiconductor substrate 31 can be performed in combination with the second semiconductor substrate 45 in which the logic circuit region 25 is formed and the supporting substrate.

(Connection Hole)

Figure 8:
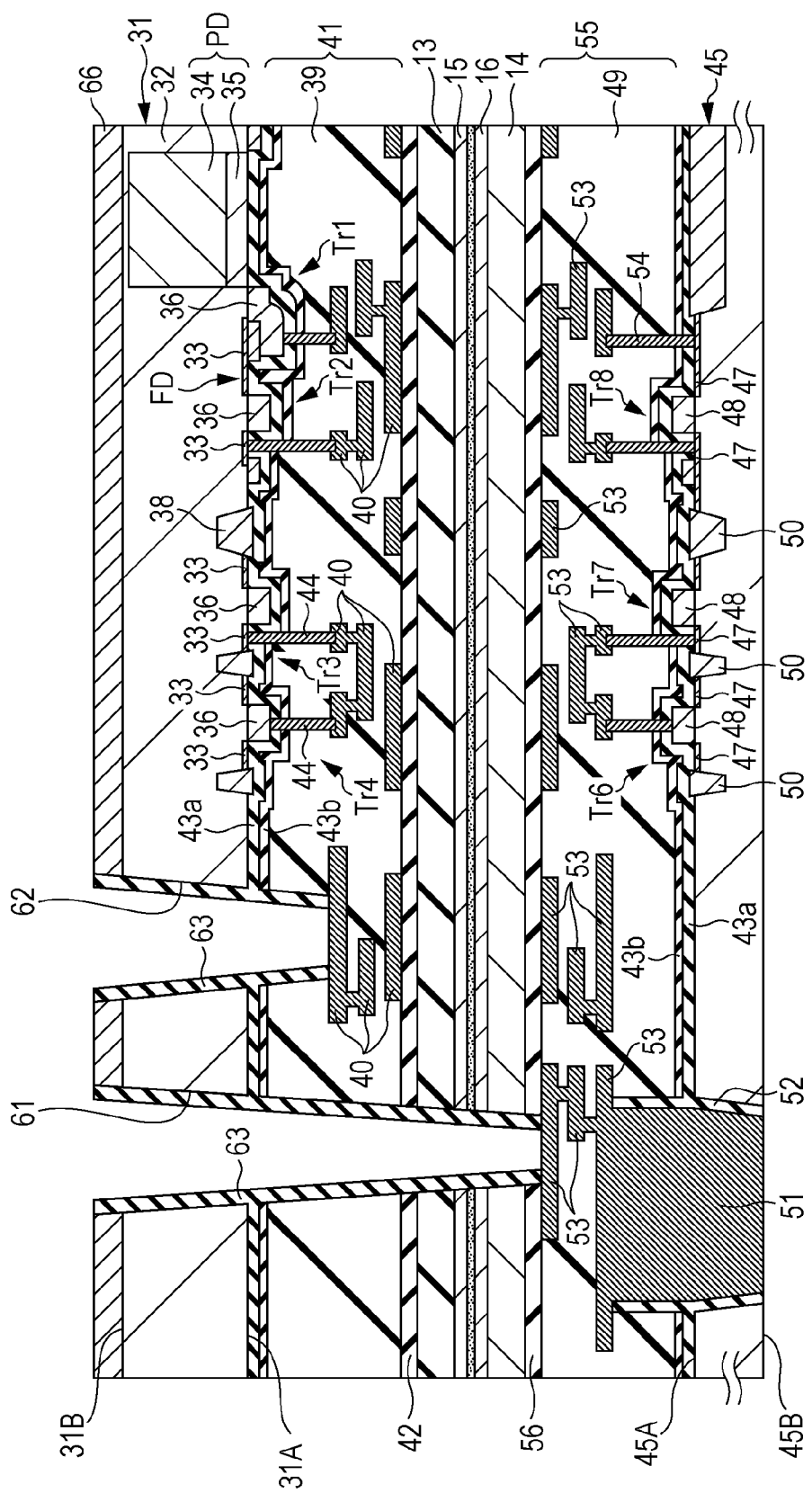
FIG. 8 is a diagram illustrating the method of manufacturing the semiconductor device according to the first embodiment.

Next, as shown in FIG. 8, the through-connection hole 61 reaching the conductor layers 53 of the second semiconductor substrate 45 from the second main surface 31B side through the first semiconductor substrate 31 is formed at a predetermined position of the thinned first semiconductor substrate 31. In addition, simultaneously with the formation of the through-connection hole 61, the connection hole 62 reaching the conductor layers 40 on the first semiconductor substrate 31 side from the second main surface 31B of the first semiconductor substrate 31 is formed close to the through-connection hole 61. The insulating layers 63 for electrical insulation from the first semiconductor substrate 31 are then formed in the inner wall surfaces of the through-connection hole 61 and the connection hole 62.

The openings of the through-connection hole 61 and the connection hole 62 can be formed with a diameter to 1 to 5 µm. Since the through-connection hole 61 and the connection hole 62 are formed after the first semiconductor substrate 31 is thinned, the aspect ratio becomes small, and thus these holes can be formed as a minute hole. The depths of the through-connection hole 61 and the connection hole 62 can be set to, for example, approximately 5 µm to 15 µm.

(Through-Electrode)

Figure 9:
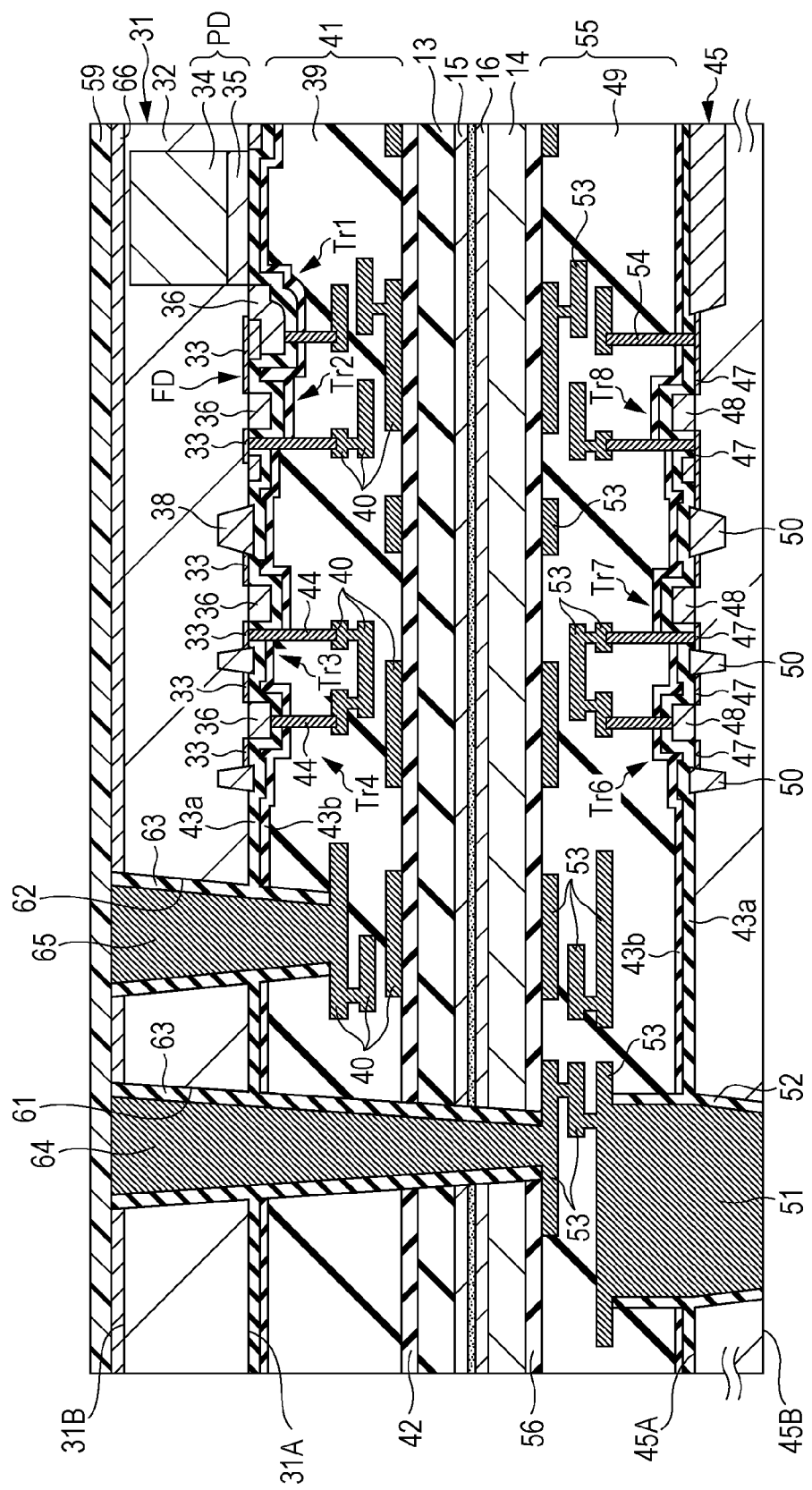
FIG. 9 is a diagram illustrating the method of manufacturing the semiconductor device according to the first embodiment.

Next, as shown in FIG. 9, conductors are buried in the through-connection hole 61 and the connection hole 62, to form the connection conductor 64 and the connection conductor 65. As a conductor for forming the connection conductor 64 and the connection conductor 65, a metal such as, for example, copper (Cu) and tungsten (W) is used. Thereafter, the passivation layer 59 is formed over the entire surface on the protective layer 66. As the passivation layer 59, for example, P—SiN, P—SiON or the like is used.

(Wiring Line)

Figure 10:
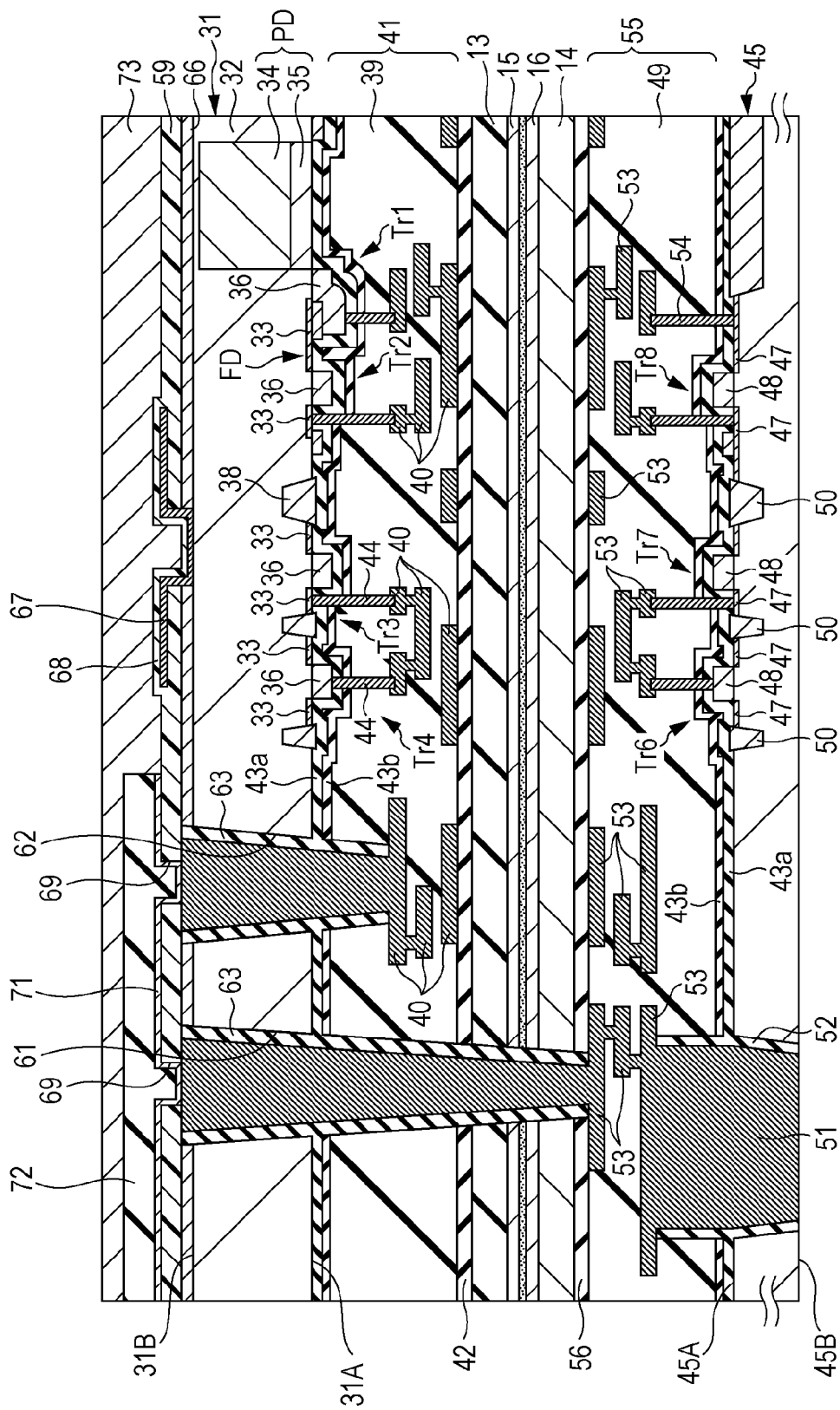
FIG. 10 is a diagram illustrating the method of manufacturing the semiconductor device according to the first embodiment.

Next, as shown in FIG. 10, the light-shielding layer 67 is formed on a region to be shielded from light. The light-shielding layer 67 is formed of, for example, a metal film such as tungsten. In FIG. 10, the light-shielding layer is schematically formed on the control circuit region 24, but is also formed other pixel transistors.

After a portion of the protective layer 66 and the passivation layer 59 is removed in the portion for forming the light-shielding layer 67 and the semiconductor well region 32 is exposed, the light-shielding layer 67 is formed so as to be in contract with the exposed semiconductor well region 32. Thereby, the light-shielding layer 67 is electrically connected to the semiconductor well region 32 as a ground potential, and thus the light-shielding layer 67 can be prevented from being in an electrically floating state.

Next, a passivation layer 68 that coats the light-shielding layer 67 is formed. As the passivation layer 68, for example, P—SiN, CVD-SiN or the like is used.

The connection holes 69 are formed in portions corresponding to the connection conductor 64 and the connection conductor 65 of the passivation layer 59.

Next, the barrier metal layer 71 communicating with the connection holes 69 on the connection conductor 64 and the connection conductor 65 is formed on the passivation layer 59. Further, the connection wiring line 72 is formed on the barrier metal layer 71. After the connection wiring line 72 is formed, the upper portion of the connection wiring line 72 serving as an electrode pad is removed, and the planarizing layer 73 is formed on the passivation layer 59, the passivation layer 68, and the connection wiring line 72.

The barrier metal layer 71 is formed of, for example, a laminated body of Ti/TiN. The connection wiring line 72 is formed of, for example, aluminum.

The connection wiring line 72 is electrically connected to the connection conductor 64 and the connection conductor 65. The connection wiring line 72 is used in the connection of the pixel region 23 and control circuit region 24 to the logic circuit region 25, and has a function of a take-off electrode from the second main surface 31B of the first semiconductor substrate 31, or a so-called electrode pad.

With such a configuration, the pixel region 23 and the control circuit region 24 formed in the first semiconductor substrate 31, and the logic circuit region 25 formed in the second semiconductor substrate 45 are electrically connected to each other through the connection conductor 65, the connection wiring line 72, and the connection conductor 64.

(Optical Element)

Figure 11:
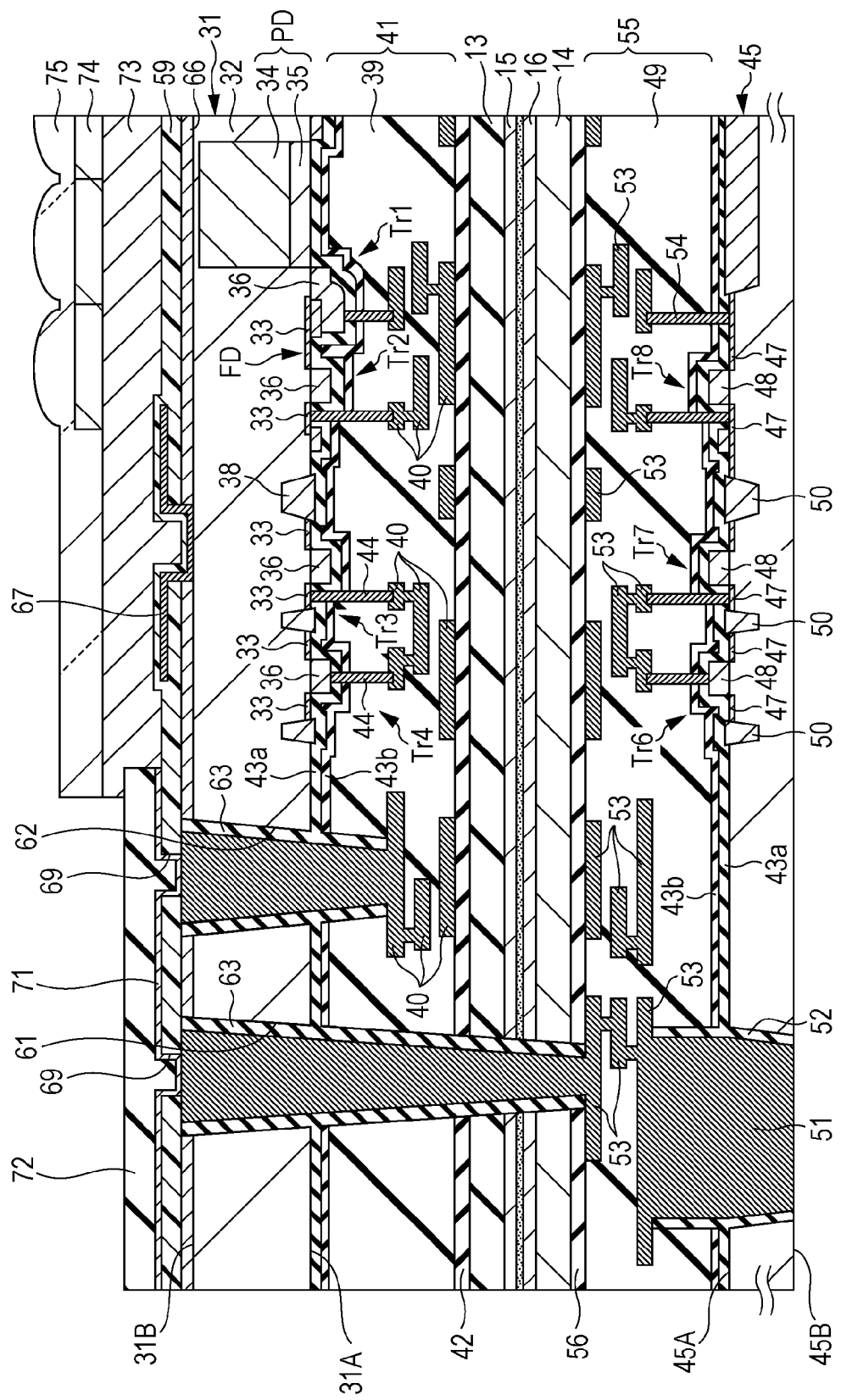
FIG. 11 is a diagram illustrating the method of manufacturing the semiconductor device according to the first embodiment.

Next, as shown in FIG. 11, the on-chip color filters 74 of, for example, red (R), green (G), and blue (B) corresponding to each pixel are formed on the planarizing layer 73 of the pixel region 23. The on-chip color microlenses 75 are then formed on the on-chip color filter 74.

Each of the on-chip color filters 74 and the on-chip color microlenses 75 are formed corresponding to each unit pixel of the pixel array.

Next, as shown in FIG. 3 mentioned above, the surface of the connection conductor 51 serving as a take-off electrode by grinding and polishing the second main surface 45B side is exposed in the second semiconductor substrate 45. The passivation layer 76 is then formed over the entire surface of the second main surface 45B of the second semiconductor substrate 45. The opening 77 is formed in the passivation layer 76, and then the spherical electrode bump 78 electrically connected to the connection conductor 51 through the opening 77 is formed.

The pixel region 23 and the control circuit region 24 are manufactured in the first semiconductor substrate 31 by the above-mentioned processes. In addition, the logic circuit region 25 is manufactured in the second semiconductor substrate 45. The first semiconductor substrate 31 and the second semiconductor substrate 45 bonded to each other are divided into each of the chips by the following process, thereby allowing the backside-illumination type MOS solid-state imaging device 79 shown in FIG. 3 mentioned above to be manufactured.

According to the method of manufacturing the semiconductor device in the embodiment, the pixel region 23 and the control circuit region 24 are formed in the first semiconductor substrate 31, and the logic circuit region 25 for performing signal processing is formed in the second semiconductor substrate 45.

Since the function of the pixel array and the function of the logic circuit are formed in different substrates, an optimum process forming technique can be used in each pixel array and logic circuit. Therefore, it is possible to sufficiently exhibit the performance of each pixel array and logic circuit, and to provide the high-performance MOS solid-state imaging device 79.

In addition, the semiconductor device in which the pixel array and the logic circuit are mixed can be manufactured using a wafer process technique in the related art, and thus can be easily manufactured.

Meanwhile, when the configuration shown in FIG. 2C is adopted, the pixel region 23 that receives light may be formed on the first semiconductor substrate 31 side. For this reason, the control circuit region 24 and the logic circuit region 25 are separated and formed in the second semiconductor substrate 45. With this configuration, it is possible to independently select an optimum process technique for each of the function chips, and to reduce an area of a manufacturing module.

In addition, in the method of manufacturing the semiconductor device of the embodiment mentioned above, after the first semiconductor substrate 31 having the pixel region 23 and the control circuit region 24 and the second semiconductor substrate 45 having the logic circuit region 25 are bonded to each other in a state where all are half-finished products, the first semiconductor substrate 31 is thinned. That is, the second semiconductor substrate 45 is used as a supporting substrate at the time of thinning the first semiconductor substrate 31. For this reason, it is possible to achieve a saving of members and a reduction in the number of manufacturing processes.

<4. Second Embodiment of Semiconductor Device>

[Configuration of Semiconductor Device]

Figure 12:
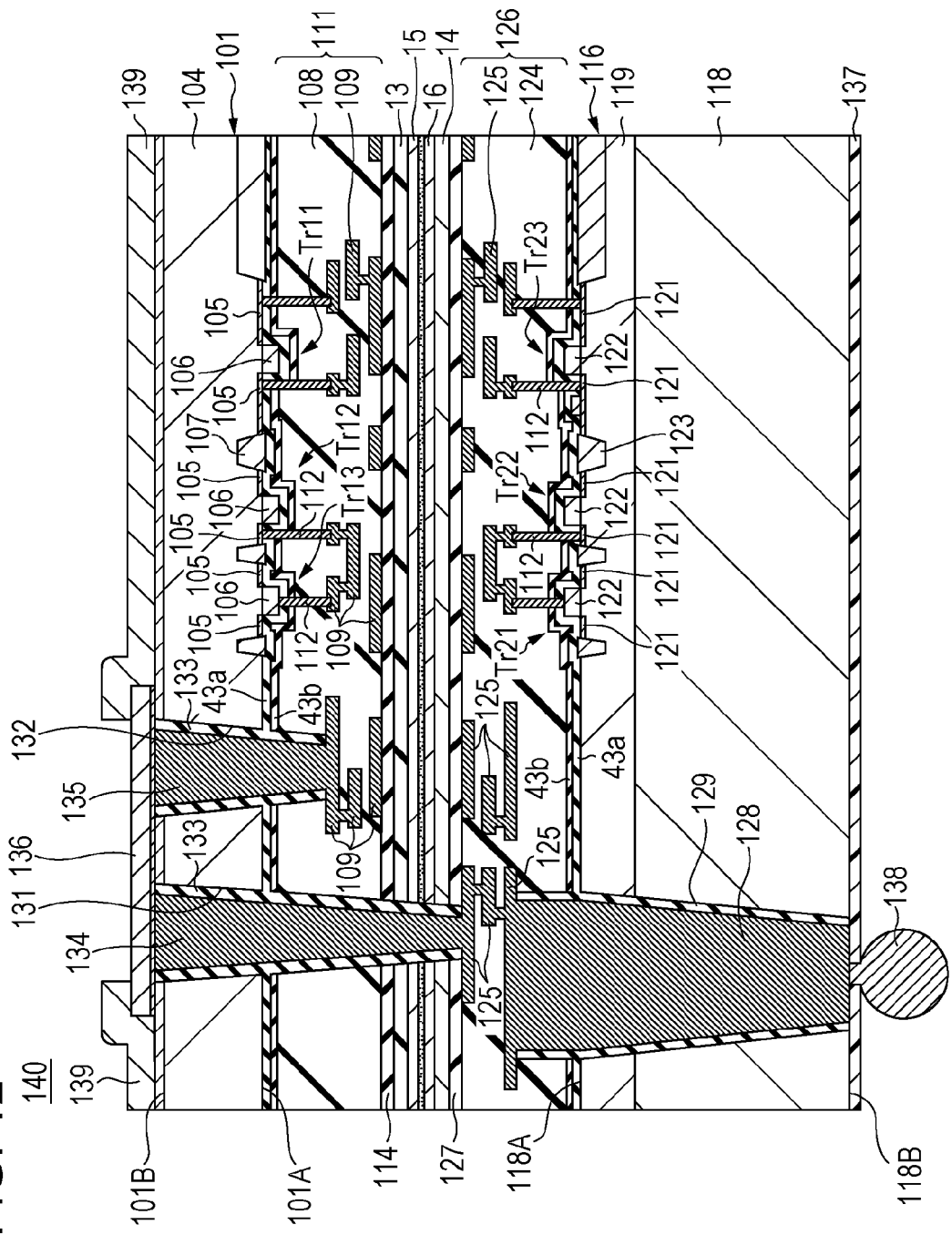
FIG. 12 is a cross-sectional view illustrating the configuration of a semiconductor device according to a second embodiment.

As a second embodiment of a semiconductor device, FIG. 12 shows a semiconductor device in which a first semiconductor substrate 101 including a first semiconductor integrated circuit and a second semiconductor substrate 116 including a second semiconductor integrated circuit are mixed.

In a semiconductor device 140 shown in FIG. 12, the first semiconductor substrate 101 and the second semiconductor substrate 116 are bonded so as to face the first main surfaces 101A and 116A to each other. The first semiconductor substrate 101 includes the first semiconductor integrated circuit, or the logic circuit in this example. In addition, the second semiconductor substrate 116 includes the second semiconductor integrated circuit, or the logic circuit in this example.

The first semiconductor substrate 101 and the second semiconductor substrate 116 are bonded to each other so that a multilayer wiring layer 111 of the first semiconductor substrate 101 and a multilayer wiring layer 126 of the second semiconductor substrate 116 face each other. This bonding is performed by the plasma bonding or the adhesive similarly to the above-mentioned embodiment.

(First Semiconductor Substrate)

The logic circuit formed in the first semiconductor substrate 101 is formed of a plurality of MOS transistors Tr11, Tr12, and Tr13 in a semiconductor well region 104 of the first semiconductor substrate 101. Each of the MOS transistors Tr11 to Tr13 is formed of a pair of source/drain regions 105, and a gate electrode 106 formed with a gate insulating film interposed therebetween. Each of the MOS transistors Tr11 to Tr13 is separated by a separation region 107.

As described above, the logic circuit of the first semiconductor substrate 101 can be composed of CMOS transistors. For this reason, a plurality of MOS transistors can be composed of n-channel MOS transistors or p-channel MOS transistors.

Therefore, when the n-channel MOS transistor is formed, an n-type source/drain region is formed in a p-type semiconductor well region. In addition, when the p-channel MOS transistor is formed, the p-type source/drain region is formed in an n-type semiconductor well region.

In addition, the multilayer wiring layer 111 in which a plurality of layers, or three conductor layers 109 in this example are laminated is formed on a first main surface 101A of the first semiconductor substrate 101 with an insulating interlayer 108 interposed therebetween. The multilayer wiring layer 111 includes the first insulating layer 43a, the second insulating layer 43b, and the insulating interlayer 108 which are formed on the first main surface 101A of the first semiconductor substrate 101, the conductor layer 111 formed within the insulating interlayer 108, and connection conductors 112 formed within connection holes of the insulating interlayer 108.

The conductor layers 109 are connected to each of the MOS transistors Tr11 to Tr13 through the necessary connection conductors 112. In addition, the conductor layers 109 of each layer are connected to each other through the connection conductors 112.

A planarizing layer 114 for planarizing the level difference generated at the time of forming the conductor layers 109 and the like in the multilayer wiring layer 111 is formed on the multilayer wiring layer 111.

In the first semiconductor substrate 101, the warpage correction layer 13 is formed on the planarizing layer 114.

The bonding layer 15 is formed on the warpage correction layer 13. The warpage correction layer 13 is made of a layer having an internal stress reverse to the warpage of the first semiconductor substrate 101, in order to correct the warpage of the first semiconductor substrate 101 in which the multilayer wiring layer 111 is formed. The bonding layer 15 is formed in order to improve the bonding reliability when the first semiconductor substrate 101 is bonded to the second semiconductor substrate 116.

(Second Semiconductor Substrate)

In addition, as shown in FIG. 12, the second semiconductor substrate 116 includes the second semiconductor integrated circuit, or the logic circuit in this example. That is, a plurality of n-channel MOS transistors Tr21, Tr22, and Tr23 are formed in regions serving as each chip portion of a semiconductor well region 119 of the second semiconductor substrate 116. Each of the MOS transistors Tr21 to Tr23 is configured to include a pair of source/drain regions 121, and a gate electrode 122 formed with a gate insulating film interposed therebetween. Each of the MOS transistors Tr21 to Tr23 is separated by separation regions 123.

As described above, the logic circuit of the second semiconductor substrate 116 can be composed of CMOS transistors. For this reason, a plurality of MOS transistors can be composed of n-channel MOS transistors or p-channel MOS transistors.

Therefore, when the n-channel MOS transistor is formed, an n-type source/drain region is formed in a p-type semiconductor well region. In addition, when the p-channel MOS transistor is formed, the p-type source/drain region is formed in an n-type semiconductor well region.

In addition, the multilayer wiring layer 126 in which a plurality of layers, or three conductor layers 125 in this example are laminated is formed on a first main surface 116A of the second semiconductor substrate 116 with an insulating interlayer 124 interposed therebetween. The multilayer wiring layer 126 includes the first insulating layer 43a, the second insulating layer 43b, and the insulating interlayer 124 which are formed on the first main surface 116A of the first semiconductor substrate 116, the conductor layers 125 formed within the insulating interlayer 124, and the connection conductors 112 formed within connection holes of the insulating interlayer 108.

The conductor layers 125 are connected to each of the MOS transistors Tr21 to Tr23 through the connection conductors 112. In addition, the conductor layers 125 of each layer are connected to each other through the connection conductors 112.

In addition, the second semiconductor substrate 116 includes a connection hole, passing through a semiconductor substrate 118 from the conductor layers 125 of the multilayer wiring layer 126, at a predetermined position, and an insulating layer 129 is formed inside this connection hole. A connection conductor 128 for a take-off electrode is formed within a connection hole covered with the insulating layer 129. In addition, a barrier metal, not shown, is provided between the connection conductor 128 and the conductor layers 125, and the insulating layer, in order to prevent diffusion to the insulating layer.

A connection hole is formed at a predetermined position of the second semiconductor substrate 116, from the surface of the insulating interlayer 124 along a desired depth position within the semiconductor substrate 118, and the connection conductor 128 for a take-off electrode is buried in this connection hole.

A passivation layer 137 is provided over the entire surface of the second semiconductor substrate 116 on the second main surface 116B side. An electrode bump 138 electrically connected to the connection conductor 51 is formed from an opening formed in the passivation layer 137.

In addition, a planarizing layer 127 for planarizing the level difference generated at the time of forming the conductor layers 109 and the like in the multilayer wiring layer 126 is formed on the multilayer wiring layer 126.

In the second semiconductor substrate 116, the warpage correction layer 14 is formed on the planarizing layer 127. The bonding layer 16 is formed on the warpage correction layer 14. The warpage correction layer 14 is made of a layer having an internal stress reverse to the warpage of the second semiconductor substrate 116, in order to correct the warpage of the second semiconductor substrate 116 in which the multilayer wiring layer 126 is formed. The bonding layer 16 is formed in order to improve the bonding reliability when the second semiconductor substrate 116 is bonded to the first semiconductor substrate 101.

(Through-Electrode)

In addition, as shown in FIG. 12, a through-electrode connected from a second main surface 101B side of the first semiconductor substrate 101 to the conductor layers 125 of the multilayer wiring layer 126 of the second semiconductor substrate 116 is formed at a position adjacent to a transistor forming region of the first semiconductor substrate 101.

The through-electrode passes through the first semiconductor substrate 101, the multilayer wiring layer 111, the planarizing layer 114, the warpage correction layer 13, and the bonding layer 15, and is formed within a through-connection hole 131 passing through the bonding layer 16, the warpage correction layer 14, and the planarizing layer 127 which are located on the second semiconductor substrate 116. The through-electrode is composed of an insulating layer 133 and a connection conductor 134 formed within the through-connection hole 131.

Further, in the first semiconductor substrate 101, a connection electrode reaching the conductor layers 109 of the multilayer wiring layer 111 of the first semiconductor substrate 101 from the second main surface 101B side is formed close to the above-mentioned through-electrode. This connection electrode passes through the first semiconductor substrate 101, and is composed of a connection hole 132 reaching the conductor layers 109 of the multilayer wiring layer 111, and the insulating layer 133 and a connection conductor 135 which are formed within the connection hole 132.

In addition, a connection wiring line 136 connecting the connection conductor 134 to the connection conductor 135 is provided on the surface of the second main surface 101B of the first semiconductor substrate 101. The connection conductor 135 and the connection conductor 134 are electrically connected to each other by this connection wiring line 136. Further, the transistor of the first semiconductor substrate 101 and the transistor of the second semiconductor substrate 116 are electrically connected to each other through the conductor layers 109 and 125 of the multilayer wiring layers 111 and 126, the connection conductor 135, the connection wiring line 136, and the connection conductor 134. The connection wiring line 136 becomes an electrode pad serving as a take-off electrode. A passivation layer 139 is formed on the surface of the second main surface 101B of the first semiconductor substrate 101 except the connection wiring line 136.

As described above, in the semiconductor device 140 according to the second embodiment, the first semiconductor substrate 101 and the second semiconductor substrate 116 are bonded to each other by the bonding layer 15 and the bonding layer 16 formed on the wiring layer forming surface side. The warpage correction layers 13 and 14 are formed on the first main surface side of the first semiconductor substrate 101 and the first main surface side of the second semiconductor substrate 116, respectively.

In the above-mentioned second embodiment, the warpage correction layers 13 and 14 are formed on the first main surface 101A side of the first semiconductor substrate 101 and the first main surface 116A side of the second semiconductor substrate 116, but the formation positions of the warpage correction layers 13 and 14 are not limited thereto. For example, when the first semiconductor substrate 101 and the second semiconductor substrate 116 are bonded to each other by the plasma bonding, and at least one of the warpages of the first semiconductor substrate 101 and the second semiconductor substrate 116 is corrected, the bonding can be performed. For this reason, the warpage correction layer is preferably formed on at least one or more of the first main surface 101A side and the second main surface 101B side of the first semiconductor substrate 101, and the first main surface 116A side and the second main surface 116B side of the second semiconductor substrate 116. The warpage correction layer is formed and any one of the warpages of the first semiconductor substrate 101 and the second semiconductor substrate 116 is corrected, whereby even when the other substrate has a warpage, the bonding by the plasma bonding can be performed.

Meanwhile, in above-mentioned second embodiment, the first semiconductor integrated circuit mounted in the first semiconductor substrate 101 can be formed as, for example, a semiconductor memory circuit instead of the logic circuit. In this case, the logic circuit serving as the second semiconductor integrated circuit mounted in the second semiconductor substrate 116 is supplied for signal processing of the semiconductor memory circuit.

In addition, the solid-state imaging device according to the first embodiment mentioned above is configured such that signal charges are used as electrons, the first conductivity type is set to a p-type, and the second conductivity type is set to an n-type, but can also be applied to a solid-state imaging device in which the signal charges are used as holes. In this case, the n-type is set to the first conductivity type, and the p-type is set to the second conductivity type by setting the conductivity types of each semiconductor substrate, the semiconductor well region or the semiconductor region to be reverse. Similarly, in the semiconductor device according to the second embodiment, the n-type may be set to the first conductivity type, and the p-type may be set to the second conductivity type by setting the conductivity types to be reverse.

Meanwhile, the present disclosure can also have the following configurations.

(1) A semiconductor device including: a first semiconductor substrate; a second semiconductor substrate, a first main surface side of the first semiconductor substrate and a first main surface side of the second semiconductor substrate being bonded to each other; and a warpage correction layer which is formed on at least one or more selected from the first main surface side of the first semiconductor substrate, the first main surface side of the second semiconductor substrate, a second main surface side of the first semiconductor substrate, and a second main surface side of the second semiconductor substrate.

(2) The semiconductor device according to the above (1), wherein the warpage correction layer has an internal stress reverse to a warpage of the semiconductor substrate.

(3) The semiconductor device according to the above (1) or (2), further including a bonding layer made of a silicon compound or an adhesive on a bonding surface of the first semiconductor substrate and a bonding surface of the second semiconductor substrate.

(4) The semiconductor device according to any one of the above (1) to (3), further including a through-electrode, passing through the first semiconductor substrate and a wiring layer formed on the first main surface side of the first semiconductor substrate, which is connected from the second main surface side of the first semiconductor substrate to a wiring layer formed on the first main surface side of the second semiconductor substrate.

(5) A method of manufacturing a semiconductor device, including: forming a warpage correction layer on at least one or more selected from a first main surface side of a first semiconductor substrate, a second main surface side of the first semiconductor substrate, a first main surface side of a second semiconductor substrate, and a second main surface side of the second semiconductor substrate; and bonding the first main surface side of the first semiconductor substrate and the first main surface side of the second semiconductor substrate to each other.

(6) The method of manufacturing a semiconductor device according to the above (5), further including forming a warpage correction layer having an internal stress reverse to a warpage of the substrate in which the warpage correction layer is formed.

(7) The method of manufacturing a semiconductor device according to the above (5) or (6), further including forming the warpage correction layer after measuring an amount of warpage of the substrate in which the warpage correction layer is formed.

(8) The method of manufacturing a semiconductor device according to any one of the above (5) to (7), further including bonding the first semiconductor substrate and the second semiconductor substrate to each other using a plasma bonding method.

(9) The method of manufacturing a semiconductor device according to any one of the above (5) to (8), further including: forming a wiring layer on the first main surface of the first semiconductor substrate; and forming a wiring layer on the first main surface of the second semiconductor substrate.

(10) The method of manufacturing a semiconductor device according to the above (9), further including: forming a connection hole, passing through the first semiconductor substrate and the wiring layer formed on the first main surface of the first semiconductor substrate from the second main surface side of the first semiconductor substrate, which communicates with the wiring layer formed on the first main surface of the second semiconductor substrate; forming an insulating layer in an inside of the connection hole; and forming a connection conductor within the connection hole.

The present disclosure contains subject matter related to that disclosed in Japanese Priority Patent Application JP 2011-071043 filed in the Japan Patent Office on Mar. 28, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a first semiconductor substrate including a pixel region in which a pixel array is formed;
a first wiring layer formed on a first main surface side of the first semiconductor substrate;
a first material layer between the first wiring layer and a bonding layer;
a second semiconductor substrate;
a second wiring layer formed on a first main surface side of the second semiconductor substrate;
a second material layer between the second wiring layer and the bonding layer; and
a planarizing layer formed between the first wiring layer and the bonding layer,
wherein,
the first main surface side of the first semiconductor substrate and the first main surface side of the second semiconductor substrate are bonded to face each other,
the first and second material layers are formed by plasma Chemical Vapor Deposition (CVD) and include a silicon compound,
the planarizing layer includes one or more of SiO2 and TEOS, and
the bonding layer includes a silicon compound.

2. The semiconductor device according to claim 1, wherein the first and second material layers include one or more of SiN, SiO, SiO2, SiOC, SiC, SiCN, FSG, and FTEOS.

3. The semiconductor device according to claim 1, wherein the bonding layer includes one or more of SiO, SiN, SiON, SiOC, and SiOCH.

4. The semiconductor device according to claim 1, further comprising a second planarizing layer formed between the second wiring layer and the bonding layer.

5. The semiconductor device according to claim 4, wherein the second planarizing layer includes a silicon compound.

6. The semiconductor device according to claim 5, wherein the second planarizing layer includes one or more of SiO2 and TEOS.

7. The semiconductor device according to claim 1, wherein the bonding layer includes a first bonding layer formed on the first material layer and a second bonding layer formed on the second material layer.

8. The semiconductor device according to claim 7, wherein the first material layer is formed between the first bonding layer and the planarizing layer.

9. The semiconductor device according to claim 7, wherein the second material layer is formed between the second bonding layer and a second planarizing layer.

10. The semiconductor device according to claim 1, wherein the bonding layer includes an adhesive.

11. The semiconductor device according to claim 1, wherein at least one of the first material layer or the second material layer is a warpage correction layer having an internal stress that is reverse to a warpage of the substrate on which the warpage correction layer is formed prior to being bonded.

12. The semiconductor device according to claim 1, further comprising a through-electrode passing through the first wiring layer formed on the first main surface side of the first semiconductor substrate, the first and second material layers, and the bonding layer, and extending to the second wiring layer formed on the first main surface side of the second semiconductor substrate, wherein the through-electrode is electrically connected to the pixel array via the first wiring layer formed on the first main surface side of the first semiconductor substrate, and the through-electrode is electrically connected to the second wiring layer formed on the first main surface side of the second semiconductor substrate.

13. The semiconductor device according to claim 12, further comprising a second through-electrode electrically connected to the through-electrode and extending from a second main surface side of the first semiconductor substrate to the first wiring layer formed on the first main surface side of the first semiconductor substrate, wherein the second wiring layer formed on the first main surface side of the second semiconductor substrate is electrically connected to the pixel array via the first wiring layer formed on the first main surface side of the first semiconductor substrate, the through-electrode, and the second through-electrode.

14. A semiconductor device comprising:
a first semiconductor substrate including a pixel region in which a pixel array is formed;
a first wiring layer formed on a first main surface side of the first semiconductor substrate;
a first material layer between the first wiring layer and a bonding layer;
a second semiconductor substrate;
a second wiring layer formed on a first main surface side of the second semiconductor substrate;
a second material layer between the second wiring layer and the bonding layer; and
a planarizing layer formed between the second wiring layer and the bonding layer,
wherein,
the first main surface side of the first semiconductor substrate and the first main surface side of the second semiconductor substrate are bonded to face each other,
the first and second material layers are formed by plasma Chemical Vapor Deposition (CVD) and include a silicon compound,
the planarizing layer includes one or more of SiO2 and TEOS, and
the bonding layer includes a silicon compound.

15. The semiconductor device according to claim 14, wherein the first and second material layers include one or more of SiN, SiO, SiO2, SiOC, SiC, SiCN, FSG, and FTEOS.

16. The semiconductor device according to claim 14, wherein the bonding layer includes one or more of SiO, SiN, SiON, SiOC, and SiOCH.

17. The semiconductor device according to claim 14, further comprising a second planarizing layer formed between the first wiring layer and the bonding layer.

18. The semiconductor device according to claim 14, wherein at least one of the first material layer or the second material layer is a warpage correction layer having an internal stress that is reverse to a warpage of the substrate on which the warpage correction layer is formed prior to being bonded.

19. The semiconductor device according to claim 14, further comprising a through-electrode passing through the first wiring layer formed on the first main surface side of the first semiconductor substrate, the first and second material layers, and the bonding layer, and extending to the second wiring layer formed on the first main surface side of the second semiconductor substrate, wherein the through-electrode is electrically connected to the pixel array via the first wiring layer formed on the first main surface side of the first semiconductor substrate, and the through-electrode is electrically connected to the second wiring layer formed on the first main surface side of the second semiconductor substrate.

20. The semiconductor device according to claim 19, further comprising a second through-electrode electrically connected to the through-electrode and extending from a second main surface side of the first semiconductor substrate to the first wiring layer formed on the first main surface side of the first semiconductor substrate, wherein the second wiring layer formed on the first main surface side of the second semiconductor substrate is electrically connected to the pixel array via the first wiring layer formed on the first main surface side of the first semiconductor substrate, the through-electrode, and the second through-electrode.

* * * * *